(12) United States Patent  
Qing et al.

(10) Patent No.: US 12,198,772 B2  
(45) Date of Patent: Jan. 14, 2025

(54) SHIFT REGISTER AND DRIVING METHOD THEREOF, GATE DRIVING CIRCUIT, AND DISPLAY DEVICE

(71) Applicants: CHENGDU BOE OPTOELECTRONICS TECHNOLOGY CO., LTD., Sichuan (CN); BOE TECHNOLOGY GROUP CO., LTD., Beijing (CN)

(72) Inventors: Haigang Qing, Beijing (CN); Yunsheng Xiao, Beijing (CN)

(73) Assignees: CHENGDU BOE OPTOELECTRONICS TECHNOLOGY CO., LTD., Sichuan (CN); BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 17/759,641

(22) PCT Filed: Aug. 20, 2021

(86) PCT No.: PCT/CN2021/113810  
§ 371 (c)(1),  
(2) Date: Jul. 28, 2022

(87) PCT Pub. No.: WO2023/019561  
PCT Pub. Date: Feb. 23, 2023

(65) Prior Publication Data  
US 2024/0185936 A1 Jun. 6, 2024

(51) Int. Cl.  
*G11C 19/00* (2006.01)  
*G09G 3/20* (2006.01)  
(Continued)

(52) U.S. Cl.  
CPC .............. *G11C 19/28* (2013.01); *G09G 3/20* (2013.01); *G09G 3/3677* (2013.01);  
(Continued)

(58) Field of Classification Search  
CPC .. G11C 19/28; G09G 2310/0286; G09G 3/20; G09G 2310/0243; G09G 3/3677; G09G 2310/0291; H09G 2310/0291  
See application file for complete search history.

(56) References Cited

U.S. PATENT DOCUMENTS 11,062,645 B1 * 7/2021 Xu ........................... G09G 3/32  
2014/0369457 A1 12/2014 Lin et al.  
(Continued)

FOREIGN PATENT DOCUMENTS

CN 103578403 A 2/2014  
CN 106601177 A 4/2017  
(Continued)

*Primary Examiner* — Tuan T Lam  
(74) *Attorney, Agent, or Firm* — Frank Gao, Esq.

(57) ABSTRACT

A shift register and a driving method thereof, a gate driving circuit, and a display device are provided. The shift register includes: an input circuit configured to input an input voltage to a first node under control of a first clock signal; a first control circuit configured to output a first control signal to a first output node under control of the first clock signal, a voltage of the first node, and a second clock signal; a second control circuit configured to output a second control signal to the second output node under control of the voltage of the first node; and an output circuit configured to write a first voltage signal or a second voltage signal into a first output terminal as a first output signal under control of the first control signal and the second control signal.

19 Claims, 13 Drawing Sheets

(51) Int. Cl.
*G09G 3/36* (2006.01)
*G11C 19/28* (2006.01)

(52) U.S. Cl.
CPC ............ *G09G 2310/0243* (2013.01); *G09G 2310/0267* (2013.01); *G09G 2310/0286* (2013.01); *G09G 2310/0291* (2013.01)

(56) References Cited

U.S. PATENT DOCUMENTS

| | | | |
|---|---|---|---|
| 2019/0073948 A1 | 3/2019 | Wang | |
| 2021/0118373 A1* | 4/2021 | Chen | G11C 19/28 |
| 2022/0028323 A1* | 1/2022 | In | G09G 3/2092 |
| 2023/0169917 A1* | 6/2023 | Xiao | G09G 3/3266 |
| | | | 345/204 |
| 2023/0237966 A1* | 7/2023 | Long | G11C 19/28 |
| | | | 345/214 |
| 2023/0298500 A1* | 9/2023 | Qing | G09G 3/3266 |
| | | | 345/213 |
| 2023/0351941 A1* | 11/2023 | In | G09G 3/2096 |

FOREIGN PATENT DOCUMENTS

| | | |
|---|---|---|
| CN | 106601190 A | 4/2017 |
| CN | 110164352 A | 8/2019 |
| CN | 110313028 A | 10/2019 |
| CN | 111445833 A | 7/2020 |
| CN | 111583850 A | 8/2020 |

\* cited by examiner

SHIFT REGISTER AND DRIVING METHOD THEREOF, GATE DRIVING CIRCUIT, AND DISPLAY DEVICE

CROSS-REFERENCE TO RELATED APPLICATIONS

This application is a national stage entry of a PCT patent application No. PCT/CN2021/113810, filed Aug. 20, 2021, which is hereby incorporated by reference in their entirety.

TECHNICAL FIELD

The embodiments of the present disclosure relate to a shift register and a driving method thereof, a gate driving circuit, and a display device.

BACKGROUND

With the rapid development of display technology, display panels are increasingly developing towards the high integration and low cost. Gate-driver on Array (GOA) technology is to directly integrate a gate driving circuit on an array substrate of a display device by a photolithography process. A GOA circuit usually includes a plurality of cascaded shift registers, each shift register corresponds to a gate line corresponding to a row of pixels (for example, each shift register provides a scan driving signal to the gate line connected to the pixels in a row) to implement the scan driving of the display panel. The GOA technology can save the space of the bonding region and the fan-out region of the gate integrated circuit (IC), thus achieving the narrow frame of the display panel, reducing the product cost, and improving the product yield.

SUMMARY

At least one embodiment of the present disclosure provides a shift register, comprising: an input circuit, a first control circuit, a second control circuit, and an output circuit. The input circuit is electrically connected to an input voltage terminal, a first clock signal terminal, and a first node, respectively, and is configured to input an input voltage provided by the input voltage terminal to the first node under control of a first clock signal provided by the first clock signal terminal; the first control circuit is electrically connected to the first clock signal terminal, a second clock signal terminal, the first node, and a first output node, respectively, and is configured to output a first control signal to the first output node under control of the first clock signal, a voltage of the first node, and a second clock signal provided by the second clock signal terminal; the second control circuit is electrically connected to the first node, the second clock signal terminal, and a second output node, respectively, and is configured to output a second control signal to the second output node under control of the voltage of the first node; and the output circuit is electrically connected to the first voltage terminal, a second voltage terminal, the first output node, the second output node, and a first output terminal, respectively, and is configured to write a first voltage signal provided by the first voltage terminal or a second voltage signal provided by the second voltage terminal into the first output terminal as a first output signal under control of the first control signal and the second control signal.

For example, in the shift register provided by at least one embodiment of the present disclosure, the first control circuit is configured to control the output circuit to output the first voltage signal at a first phase; the second control circuit is configured to control the output circuit to output the second voltage signal at a second phase; and the first output signal comprises the first voltage signal in the first phase and the second voltage signal in the second phase.

For example, in the shift register provided by at least one embodiment of the present disclosure, the output circuit is further configured to write a third voltage signal into the first output terminal in the second phase under control of the first control signal and the second control signal, the first output signal further comprises the third voltage signal, and a voltage absolute value of the third voltage signal is less than a voltage absolute value of the second voltage signal.

For example, in the shift register provided by at least one embodiment of the present disclosure, the first control circuit comprises a first control input sub-circuit, the first control input sub-circuit is electrically connected to the first clock signal terminal and a second node, respectively, and is configured to write a third control signal to the second node under control of the first clock signal.

For example, in the shift register provided by at least one embodiment of the present disclosure, the first control circuit is further electrically connected to the first voltage terminal and the input circuit, the second control input sub-circuit is electrically connected to the input circuit, the second clock signal terminal, the first voltage terminal, and a second node, respectively, and is configured to write the first voltage signal into the second node under control of the input voltage and the second clock signal.

For example, in the shift register provided by at least one embodiment of the present disclosure, the first control circuit comprises a first bootstrap sub-circuit, a first control output sub-circuit, and a second control output sub-circuit, the first bootstrap sub-circuit is electrically connected to a second node, a third node, and the second clock signal terminal, respectively, and is configured to write a first intermediate signal into the third node under control of a voltage of the second node; the first control output sub-circuit is electrically connected to the second clock signal terminal, the third node, and the first output node, respectively, and is configured to write a second intermediate signal determined based on the first intermediate signal into the first output node under control of the second clock signal; the second control output sub-circuit is electrically connected to the first node, the first voltage terminal, and the first output node, respectively, and is configured to write the first voltage signal into the first output node under control of the voltage of the first node, the first control signal comprises the second intermediate signal and the first voltage signal.

For example, in the shift register provided by at least one embodiment of the present disclosure, the input circuit comprises an input terminal connected to the input voltage terminal and an output terminal connected to the first node, the second control input sub-circuit is electrically connected to the output terminal of the input circuit, or the second control input sub-circuit is electrically connected to the input terminal of the input circuit.

For example, in the shift register provided by at least one embodiment of the present disclosure, the first control input sub-circuit comprises a first pull-down transistor, a first electrode of the first pull-down transistor is electrically connected to the first clock signal terminal, a second electrode of the first pull-down transistor is electrically connected to the second node, and a gate electrode of the first pull-down transistor is electrically connected to the first clock signal terminal.

For example, in the shift register provided by at least one embodiment of the present disclosure, the second control input sub-circuit comprises a first pull-up transistor and a second pull-up transistor, a first electrode of the first pull-up transistor is electrically connected to a second electrode of the second pull-up transistor, a second electrode of the first pull-up transistor is electrically connected to the second node, a gate electrode of the first pull-up transistor is electrically connected to the second clock signal terminal, a gate electrode of the second pull-up transistor is electrically connected to the input terminal of the input circuit or the output terminal of the input circuit, and a first electrode of the second pull-up transistor is electrically connected to the first voltage terminal.

For example, in the shift register provided by at least one embodiment of the present disclosure, the first bootstrap sub-circuit comprises a first capacitor and a first bootstrap transistor, a gate electrode of the first bootstrap transistor is electrically connected to the second node and a first terminal of the first capacitor, a second electrode of the first bootstrap transistor is electrically connected to a second terminal of the first capacitor and the third node, and a first electrode of the first bootstrap transistor is electrically connected to the second clock signal terminal; the first control output sub-circuit comprises a first control output transistor, a gate electrode of the first control output transistor is electrically connected to the second clock signal terminal, a first electrode of the first control output transistor is electrically connected to the third node, and a second electrode of the first control output transistor is electrically connected to the first output node; and the second control output sub-circuit comprises a second control output transistor, a gate electrode of the second control output transistor is electrically connected to the first node, a first electrode of the second control output transistor is electrically connected to the first voltage terminal, and a second electrode of the second control output transistor is electrically connected to the first output node.

For example, in the shift register provided by at least one embodiment of the present disclosure, the first control circuit further comprises a holding sub-circuit, the holding sub-circuit is electrically connected to the first voltage terminal, the first node, and the first output node, respectively, and is configured to maintain a level of the first node in the first phase.

For example, in the shift register provided by at least one embodiment of the present disclosure, the holding sub-circuit comprises a holding transistor, a first electrode of the holding transistor is electrically connected to the first voltage terminal, a second electrode of the holding transistor is electrically connected to the first node, and a gate electrode of the holding transistor is electrically connected to the first output node.

For example, in the shift register provided by at least one embodiment of the present disclosure, the first control circuit is further electrically connected to the second voltage terminal, the first control circuit further comprises a first isolation sub-circuit, an input terminal of the first isolation sub-circuit is electrically connected to the second node, an output terminal of the first isolation sub-circuit is electrically connected to the first bootstrap sub-circuit, and a control terminal of the first isolation sub-circuit is electrically connected to the second voltage terminal.

For example, in the shift register provided by at least one embodiment of the present disclosure, the first isolation sub-circuit comprises a first isolation transistor, a first electrode of the first isolation transistor is electrically connected to the second node, a second electrode of the first isolation transistor is electrically connected to the first bootstrap sub-circuit, and a gate electrode of the first isolation transistor is electrically connected to the second voltage terminal.

For example, in the shift register provided by at least one embodiment of the present disclosure, the first control circuit further comprises a storage sub-circuit, the storage sub-circuit is electrically connected to the first voltage terminal and the first output node, respectively, and is configured to store a voltage of the first output node.

For example, in the shift register provided by at least one embodiment of the present disclosure, the storage sub-circuit comprises a storage capacitor, a first terminal of the storage capacitor is electrically connected to the first voltage terminal, and a second terminal of the storage capacitor is electrically connected to the first output node.

For example, in the shift register provided by at least one embodiment of the present disclosure, the second control circuit comprises a second bootstrap sub-circuit, the second bootstrap sub-circuit is electrically connected to the first node, the second clock signal terminal, and the second output node, respectively.

For example, in the shift register provided by at least one embodiment of the present disclosure, the second bootstrap sub-circuit comprises a second capacitor and a second bootstrap transistor, a first electrode of the second bootstrap transistor is electrically connected to the second clock signal terminal, a first terminal of the second capacitor is electrically connected to a gate electrode of the second bootstrap transistor and the second output node, and a second terminal of the second capacitor is electrically connected to a second electrode of the second bootstrap transistor.

For example, in the shift register provided by at least one embodiment of the present disclosure, the second control circuit further comprises a second isolation sub-circuit, an input terminal of the second isolation sub-circuit is electrically connected to the first node, an output terminal of the second isolation sub-circuit is electrically connected to the second output node, and a control terminal of the second isolation sub-circuit is electrically connected to the second voltage terminal.

For example, in the shift register provided by at least one embodiment of the present disclosure, the second isolation sub-circuit comprises a second isolation transistor, a first electrode of the second isolation transistor is electrically connected to the first node, a second electrode of the second isolation transistor is electrically connected to the second output node, and a gate electrode of the second isolation transistor is electrically connected to the second voltage terminal.

For example, in the shift register provided by at least one embodiment of the present disclosure, the output circuit comprises a first output sub-circuit and a second output sub-circuit, the first output sub-circuit is electrically connected to the first output node, the first voltage terminal, and the first output terminal, respectively, and is configured to write the first voltage signal into the first output terminal in the first phase under control of the first control signal; the second output sub-circuit is electrically connected to the second output node, the second voltage terminal, and the first output terminal, respectively, and is configured to write the second voltage signal into the first output terminal in the second phase under control of the second control signal.

For example, in the shift register provided by at least one embodiment of the present disclosure, the first output sub-circuit comprises a first output transistor, a gate electrode of the first output transistor is electrically connected to the first output node, a first electrode of the first output transistor is electrically connected to the first voltage terminal, and a second electrode of the first output transistor is electrically connected to the first output terminal; the second output sub-circuit comprises a second output transistor, a gate electrode of the second output transistor is electrically connected to the second output node, a first electrode of the second output transistor is electrically connected to the second voltage terminal, and a second electrode of the second output transistor is electrically connected to the first output terminal.

For example, in the shift register provided by at least one embodiment of the present disclosure, the shift register further comprises an output inverting circuit, the output inverting circuit is electrically connected to the first output node, the first voltage terminal, the second voltage terminal, the first output terminal, and a second output terminal, respectively, and is configured to invert the first output signal to obtain a second output signal and output the second output signal to the second output terminal.

For example, in the shift register provided by at least one embodiment of the present disclosure, the output inverting circuit comprises a first output inverting sub-circuit, a second output inverting sub-circuit, and an output inverting control sub-circuit, the output inverting control sub-circuit is electrically connected to the first voltage terminal, the first output node, the second voltage terminal, and a fourth node, respectively, and is configured to output a fourth control signal to the fourth node under control of the first control signal and the first output signal; the first output inverting sub-circuit is electrically connected to the first voltage terminal, the first output terminal, and the second output terminal, respectively, and is configured to write the first voltage signal into the second output terminal in the second phase under control of the first output signal; the second output inverting sub-circuit is electrically connected to the second voltage terminal, the fourth node, and the second output terminal, respectively, and is configured to write the second voltage signal into the second output terminal in the first phase under control of the fourth control signal; and the second output signal comprises the second voltage signal in the first phase and the first voltage signal in the second phase.

For example, in the shift register provided by at least one embodiment of the present disclosure, the output inverting control sub-circuit comprises a pull-up sub-circuit, a pull-down sub-circuit, and a third bootstrap sub-circuit, the pull-up sub-circuit is electrically connected to the first voltage terminal, the first output terminal, and the fourth node, respectively, and is configured to write the first voltage signal into the fourth node under control of the first output signal; the pull-down sub-circuit is electrically connected to the first output node, the second voltage terminal, and the fourth node, respectively, and is configured to write a third intermediate signal determined based on the second voltage signal into the fourth node under control of the first control signal; the third bootstrap sub-circuit is electrically connected to the fourth node and the first clock signal terminal, respectively, and is configured to write a fourth intermediate signal determined based on the third intermediate signal and the first clock signal into the fourth node under control of a voltage of the fourth node, and the fourth control signal comprises the first voltage signal, the third intermediate signal, and the fourth intermediate signal.

For example, in the shift register provided by at least one embodiment of the present disclosure, the first output inverting sub-circuit comprises a first output inverting transistor, and the second output inverting sub-circuit comprises a second output inverting transistor, a gate electrode of the first output inverting transistor is electrically connected to the first output terminal, a first electrode of the first output inverting transistor is electrically connected to the first voltage terminal, and a second electrode of the first output inverting transistor is electrically connected to the second output terminal; and a gate electrode of the second output inverting transistor is electrically connected to the fourth node, a first electrode of the second output inverting transistor is electrically connected to the second voltage terminal, and a second electrode of the second output inverting transistor is electrically connected to the second output terminal.

For example, in the shift register provided by at least one embodiment of the present disclosure, the pull-up sub-circuit comprises a third pull-up transistor, a gate electrode of the third pull-up transistor is electrically connected to the first output terminal, a first electrode of the third pull-up transistor is electrically connected to the first voltage terminal, and a second electrode of the third pull-up transistor is electrically connected to the fourth node; the pull-down sub-circuit comprises a second pull-down transistor, a gate electrode of the second pull-down transistor is electrically connected to the first output node, a first electrode of the second pull-down transistor is electrically connected to the second voltage terminal, and a second electrode of the second pull-down transistor is electrically connected to the fourth node; and the third bootstrap sub-circuit comprises a third capacitor and a third bootstrap transistor, a first terminal of the third capacitor and a gate electrode of the third bootstrap transistor are both electrically connected to the fourth node, a second electrode of the third bootstrap transistor is electrically connected to a second terminal of the third capacitor, and a first electrode of the third bootstrap transistor is electrically connected to the first clock signal terminal.

For example, in the shift register provided by at least one embodiment of the present disclosure, the input circuit comprises an input transistor, a first electrode of the input transistor is electrically connected to the input voltage terminal, a second electrode of the input transistor is electrically connected to the first node, and a gate electrode of the input transistor is electrically connected to the first clock signal terminal.

At least one embodiment of the present disclosure further provides a gate driving circuit, comprising the shift register described in any embodiment of the present disclosure.

For example, in the gate driving circuit provided by at least one embodiment of the present disclosure, the gate driving circuit comprises a plurality of the shift registers in cascade, except for a first stage shift register, a first output terminal of an M-th stage shift register is used as an input voltage terminal connected to an (M+1)-th stage shift register, where M is a positive integer, and M is greater than 1.

For example, the gate driving circuit provided in at least one embodiment of the present disclosure further comprises a signal generation circuit, the signal generation circuit is configured to generate a first signal and a second signal, the first signal is applied to a first clock signal terminal connected to a (2N−1)-th stage shift register and a second clock signal terminal connected to a (2N)-th stage shift register, the second signal is applied to a second clock signal terminal connected to the (2N−1)-th stage shift register and a first clock signal terminal connected to the (2N)-th stage shift register; where N is a positive integer, and N is greater than or equal to 1.

At least one embodiment of the present disclosure further provides a display device including the gate driving circuit according to any embodiment of the present disclosure.

At least one embodiment of the present disclosure further provides a driving method of a shift register for driving the shift register according to any embodiment of the present disclosure, the output circuit outputs the first voltage signal at a first phase and the second voltage signal at a second phase, the second phase comprises an input phase and a stabilization phase, the driving method comprises: at the input phase, inputting the input voltage to the first node; in the first phase, under control of the first control signal, outputting the first voltage signal to the first output terminal; at the stabilization phase, under control of the second control signal, outputting the second voltage signal to the first output terminal.

For example, in the driving method provided by at least one embodiment of the present disclosure, the second phase further comprises a buffer phase, the driving method further comprises: at the buffer phase, under control of the second control signal, outputting a third voltage signal to the first output terminal, the first output signal further comprises the third voltage signal, and a voltage absolute value of the third voltage signal is less than a voltage absolute value of the second voltage signal.

For example, in the driving method provided by at least one embodiment of the present disclosure, in a case that the first control circuit is electrically connected to the input voltage terminal, a pulse width of the input voltage at a first level is great than a period of the first clock signal and a period of the second clock signal.

BRIEF DESCRIPTION OF THE DRAWINGS

In order to clearly illustrate the technical solutions of the embodiments of the present disclosure, the drawings of the embodiments will be briefly described in the following; it is obvious that the described drawings are only related to some embodiments of the present disclosure and thus are not limitative to the present disclosure.

DETAILED DESCRIPTION

In order to make objects, technical solutions, and advantages of the embodiments of the present disclosure more apparent, the technical solutions of the embodiments of the present disclosure will be described in a clearly and fully understandable way in connection with the drawings related to the embodiments of the present disclosure. Apparently, the described embodiments are just a part but not all of the embodiments of the present disclosure. Based on the described embodiments of the present disclosure, those skilled in the art can obtain other embodiment(s), without any inventive work, which should be within the scope of the present disclosure.

Unless otherwise defined, all the technical and scientific terms used in the present disclosure have the same meanings as commonly understood by one of ordinary skill in the art to which the present disclosure belongs. The terms "first," "second," etc., which are used in the present disclosure, are not intended to indicate any sequence, amount or importance, but distinguish various components. The terms "comprise," "comprising," "include," "including," etc., are intended to specify that the elements or the objects stated before these terms encompass the elements or the objects and equivalents thereof listed after these terms, but do not preclude the other elements or objects. The phrases "connect", "connected", etc., are not intended to define a physical connection or mechanical connection, but may include an electrical connection, directly or indirectly. "On," "under," "right," "left" and the like are only used to indicate relative position relationship, and when the absolute position of the object which is described is changed, the relative position relationship may be changed accordingly. In order to keep the following description of the embodiments of the present disclosure clear and concise, the present disclosure omits a detailed description of some well-known functions and well-known components.

The existing shift register circuit integrated on the display panel can generally implement the following functions: using N-type transistors to implement the shift output of high-level pulse signals, and using P-type transistors to implement the shift output of low-level pulse signals.

Figure 1A:
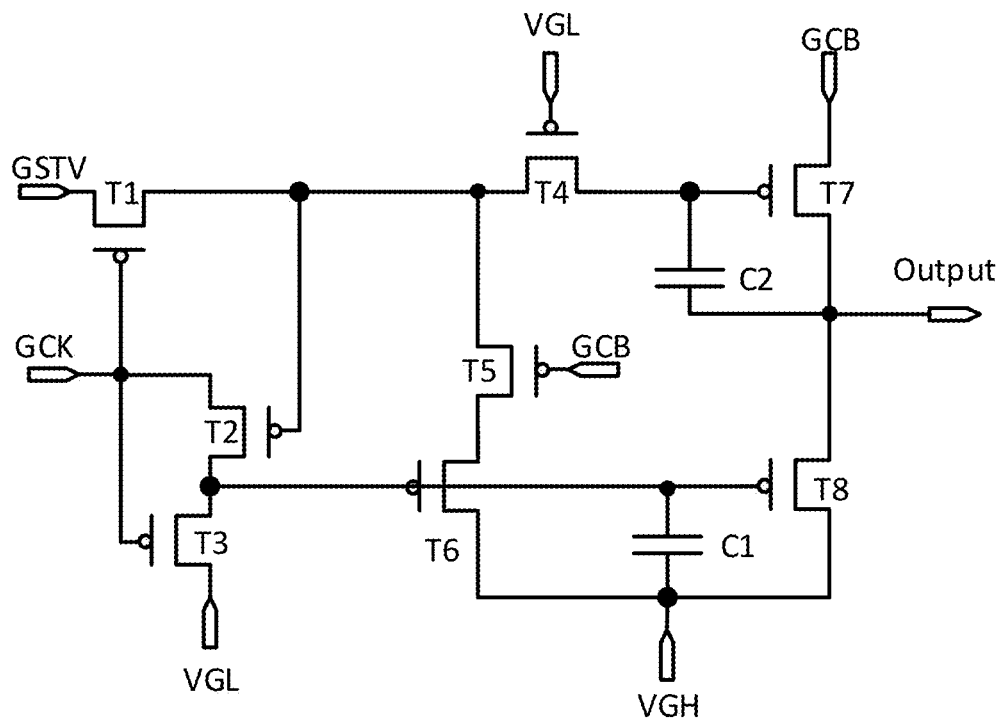
FIG. 1A is a schematic structural diagram of a shift register circuit.
Figure 1B:
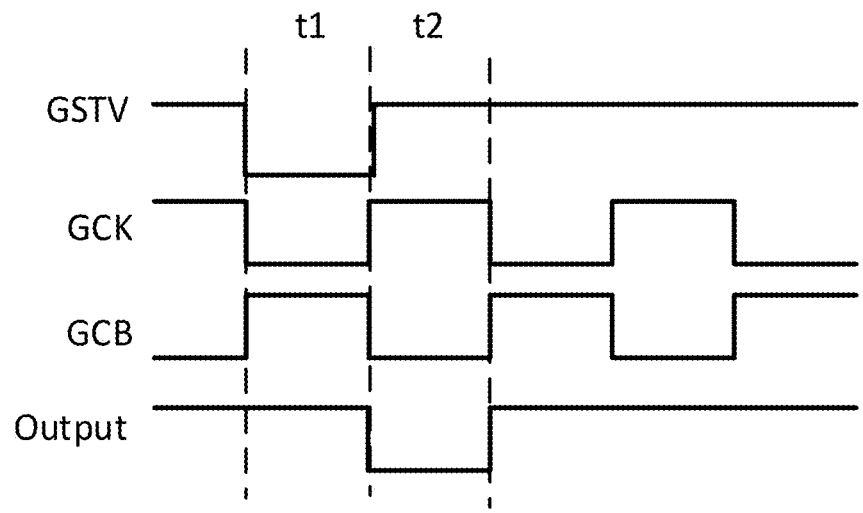
FIG. 1B is a driving timing diagram corresponding to the shift register circuit shown in FIG. 1A.

FIG. 1A is a schematic structural diagram of a shift register circuit constructed based on P-type transistors, and FIG. 1B is a driving timing diagram corresponding to the shift register circuit shown in FIG. 1A.

As shown in FIGS. 1A and 1B, the shift register circuit can achieve to output low-level signals. For example, at a phase t1 shown in FIG. 1B, at this phase, a first signal terminal GCK provides a low-level signal and a second signal terminal GCB provides a high-level signal, a transistor T1 is turned on, and an input signal terminal GSTV inputs a low-level signal through the transistor T1 and the low-level signal is stored in a capacitor C2, so that a transistor T7 is turned on. At a phase t2, the second signal terminal GCB provides a low-level signal and the first signal terminal GCK provides a high-level signal. The low-level signal (which can be equal to the low-level signal VL, for example) of the second signal terminal GCB is output to the output terminal Output by a transistor T7 at a turn-on state, that is, the output terminal Output outputs the low-level signal. In a time period when there is no need to output a low-level signal, a signal of the input signal terminal GSTV are all at a high level, a transistor T3 are turned on by the first signal terminal GCK every half cycle, and the low-level signal VL is written into the capacitor C1 through the transistor T3, so that a transistor T6 and a transistor T8 are kept in a normally turn-on state. When a transistor T5 is turned on under the control of the signal provided by the second signal terminal GCB, the high-level signal VGH is written into a capacitor C2 through the transistor T6 and the transistor T5, thereby controlling the transistor T7 to turn off. At this time, the high-level signal VGH is output to the output terminal Output through a transistor T8, that is, the output terminal Output outputs the high-level signal VGH.

At present, in organic light-emitting diode display panels (OLED), all backplane circuits are generally implemented by P-type transistor technology, and gate driving circuits (e.g., GOA circuits) often need to output high-level pulse signals, that is, P-type transistors need to be used to construct the shift register circuit that outputs high-level pulse signals. However, the key difficulty is that a start signal at the input signal terminal is at a high level, the high level cannot enable the transistor T7 to be turned on in advance like the shift register in FIG. 1A, while the transistors for constructing the circuit are all P-type transistors, and the P-type transistors can be turned on when receiving a low level, which enables it impossible to use the existing ideas to implement the shift function of the level opposite to the turn-on level of the transistor.

At least one embodiment of the present disclosure provides a shift register and a driving method thereof, a gate driving circuit, and a display device. The shift register comprises an input circuit, a first control circuit, a second control circuit, and an output circuit, the input circuit is electrically connected to an input voltage terminal, a first clock signal terminal, and a first node, respectively, and is configured to input an input voltage provided by the input voltage terminal to the first node under control of a first clock signal provided by the first clock signal terminal; the first control circuit is electrically connected to the first clock signal terminal, a second clock signal terminal, the first node, and a first output node, respectively, and is configured to output a first control signal to the first output node under control of the first clock signal, a voltage of the first node, and a second clock signal provided by the second clock signal terminal; the second control circuit is electrically connected to the first node, the second clock signal terminal, and a second output node, respectively, and is configured to output a second control signal to the second output node under control of the voltage of the first node; and the output circuit is electrically connected to the first voltage terminal, a second voltage terminal, the first output node, the second output node, and a first output terminal, respectively, and is configured to write a first voltage signal provided by the first voltage terminal or a second voltage signal provided by the second voltage terminal into the first output terminal as a first output signal under control of the first control signal and the second control signal.

The shift register controls the output circuit to output a level opposite to the turn-on level of the transistor through the first control circuit and the second control circuit, for example, when the transistor is a P-type transistor, a high-level signal is output. In addition, the shift register circuit can achieve that the P-type transistor outputs a low-level signal without threshold loss, thereby improving the display quality of the display panel; on the other hand, the shift register has a simple structure and a low production cost.

In the embodiment of the present disclosure, a transistor refers to an element including at least a gate electrode, a drain electrode, and a source electrode. There is a channel between the drain electrode (a drain electrode terminal, a drain region, or the drain electrode) and the source electrode (a source electrode terminal, a source region, or the source electrode) of the transistor, and a current can flow through the drain electrode, the channel, and the source electrode. It should be noted that, in the present disclosure, the channel refers to a portion of an active layer corresponding to the orthographic projection of the gate electrode of the transistor on the active layer, that is, a region where the current mainly flows.

It should be noted that the transistors used in the embodiments of the present disclosure can all be thin film transistors, field effect transistors, or other switching devices with the same characteristics. A source electrode and a drain electrode of the transistor used here can be symmetrical in structure, so the source electrode and the drain electrode of the transistor can be indistinguishable in structure. In the embodiments of the present disclosure, in order to distinguish the two electrodes of the transistor except a gate electrode, one electrode is directly described as the first electrode and the other electrode is directly described as the second electrode, so the first electrode and the second electrode of all or part of the transistors in the embodiments of the present disclosure can be interchanged as required. For example, the first electrode of the transistor described in the embodiments of the present disclosure may be the source electrode and the second electrode may be the drain electrode; or, the first electrode of the transistor is the drain electrode and the second electrode is the source electrode. In addition, transistors can be divided into N-type transistors and P-type transistors according to their characteristics. When the transistor is a P-type transistor, the turn-on level is a low level, that is, the turn-on voltage is a low-level voltage (for example, 0V, −5V, or other values), and the turn-off level is a high level, that is, the turn-off voltage is a high-level voltage (for example, 5V, 10V, or other values); when the transistor is an N-type transistor, the turn-on level is a high level, that is, the turn-on voltage is a high-level voltage (for example, 5V, 10V, or other values), and the turn-off level is a low level, that is, the turn-off voltage is a low level (for example, 0V, −5V, or other values).

It should be noted that, because a P-type transistor (e.g., a thin film transistor) has a threshold loss when transmitting a low-level signal, when a signal at a low level is transmitted from the first electrode of the P-type transistor to the second electrode of the P-type transistor, there is a voltage difference between the voltage of the second electrode of the P-type transistor and the voltage of the first electrode of the P-type transistor, the voltage difference is the threshold voltage of the P-type transistor. Because there is no threshold loss when the P-type transistor transmits a high-level signal, when the signal at a high level is transmitted from the first electrode of the P-type transistor to the second electrode of the P-type transistor, there is no voltage difference between the voltage of the second electrode of the P-type transistor and the voltage of the first electrode of the P-type transistor. That is, in the present disclosure, a threshold voltage loss will occur after the low-level signal is "transmitted" through the P-type transistor, and the voltage will remain unchanged after the high-level signal is "transmitted" through the P-type transistor.

Similarly, when the type of transistor is an N-type, similarly, the N-type transistor has a threshold loss when transmitting a high-level signal, which will not be repeated here.

The embodiments of the present disclosure will be described in detail below with reference to the accompanying drawings, but the present disclosure is not limited to these specific embodiments.

Figure 2A:
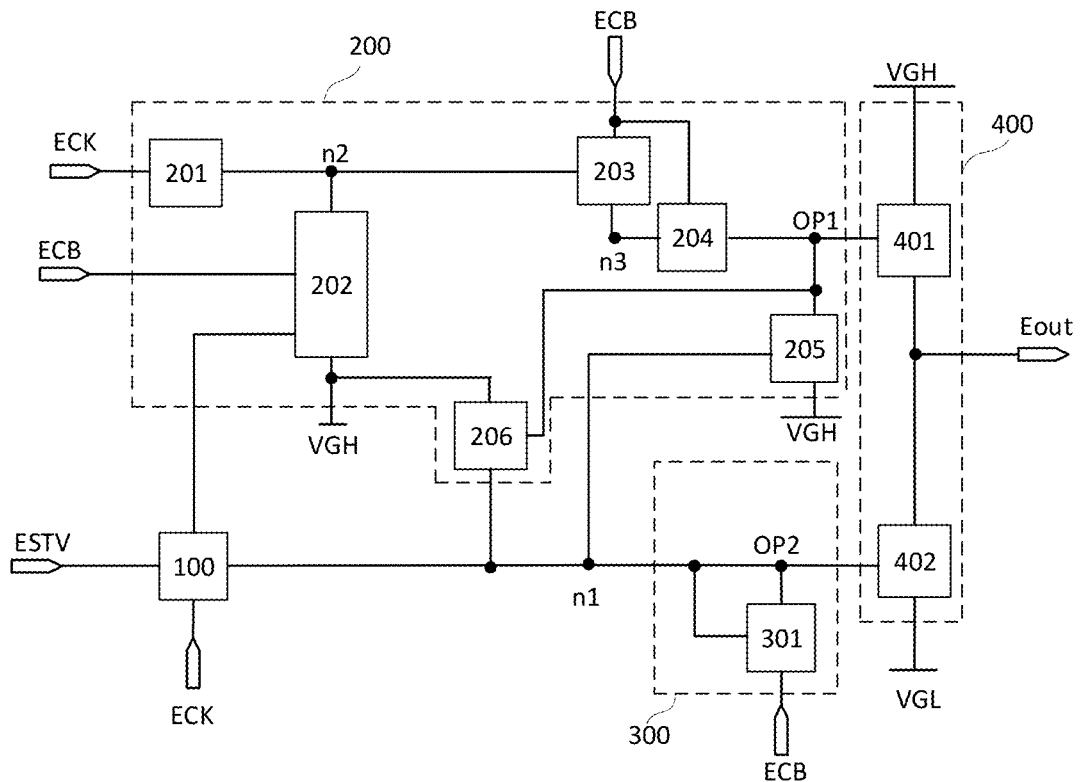
FIG. 2A is a schematic block diagram of a shift register provided by at least one embodiment of the present disclosure.

FIG. 2A is a schematic block diagram of a shift register provided by at least one embodiment of the present disclosure.

The embodiment of the present disclosure provides a shift register. For example, as shown in FIG. 2A, the shift register includes an input circuit 100, a first control circuit 200, a second control circuit 300, and an output circuit 400.

For example, as shown in FIG. 2A, the input circuit 100 is electrically connected to an input voltage terminal ESTV, a first clock signal terminal ECK, and a first node n1, respectively, and is configured to input an input voltage Vin provided by the input voltage terminal ESTV to the first node n1 under the control of a first clock signal VECK provided by the first clock signal terminal ECK. That is, under the control of the first clock signal VECK, when the input circuit 100 is turned on, that is, when one terminal of the input circuit 100 connected to the input voltage terminal ESTV and the other terminal of the input circuit 100 connected to the first node n1 are turned on, the input voltage Vin can be transmitted to the first node n1.

The first control circuit 200 is electrically connected to the first clock signal terminal ECK, a second clock signal terminal ECB, the first node n1, and a first output node OP1, respectively, and is configured to output a first control signal Vctr1 to the first output node OP1 under the control of the first clock signal VECK, a voltage of the first node n1, and a second clock signal VECB provided by the second clock signal terminal ECB, and the first control signal Vctr1 is configured to implement the turn-on and turn-off between the first voltage terminal VGH and the first output terminal Eout.

The second control circuit 300 is electrically connected to the first node n1, the second clock signal terminal ECB, and a second output node OP2, respectively, and is configured to output a second control signal Vctr2 to the second output node OP2 under the control of the voltage of the first node n1, and the second control signal Vctr2 is configured to implement the turn-on and turn-off between the second voltage terminal VGL and the first output terminal Eout.

The output circuit 400 is electrically connected to the first voltage terminal VGH, a second voltage terminal VGL, the first output node OP1, the second output node OP2, and a first output terminal Eout, respectively, and is configured to write a first voltage signal VH provided by the first voltage terminal VGH or a second voltage signal VL provided by the second voltage terminal VGL into the first output terminal Eout as a first output signal Vout under the control of the first control signal Vctr1 and the second control signal Vctr2.

For example, the first control circuit 200 is configured to control the output circuit 400 to output the first voltage signal VH as the first output signal Vout at a first phase. For example, the second control circuit 300 is configured to control the output circuit 400 to output the second voltage signal VL as the first output signal Vout at a second phase. That is, the first output signal Vout includes the first voltage signal VH in the first phase and the second voltage signal VL in the second phase.

For example, as shown in FIG. 2A, the first control circuit 200 is also electrically connected to the first voltage terminal VGH and the input circuit 100. For example, the first control circuit 200 includes a first control input sub-circuit 201, a second control input sub-circuit 202, a first bootstrap sub-circuit 203, a first control output sub-circuit 204, a second control output sub-circuit 205, and a holding sub-circuit 206.

For example, the first control input sub-circuit 201 is electrically connected to the first clock signal terminal ECK and the second node n2, respectively, and is configured to write the third control signal Vctr3 to the second node n2 under the control of the first clock signal VECK. For example, when the first control input sub-circuit 201 is turned on, that is, when one terminal of the first control input sub-circuit 201 connected to the first signal terminal ECK and the other terminal of the first control input sub-circuit 201 connected to the second node n2 are turned on, the first clock signal VECK at a second level is written into the second node n2 as a third control signal Vctr3, so that a voltage of the second node n2 is at the second level.

The second control input sub-circuit 202 is electrically connected to the input circuit 100, the second clock signal terminal ECB, the first voltage terminal VGH, and the second node n2, respectively, and is configured to write the first voltage signal VH into the second node n2 under the control of the input voltage Vin and the second clock signal VECB. For example, when the second control input sub-circuit 202 is turned on, that is, when one terminal of the second control input sub-circuit 202 connected to the first voltage terminal VGH and the other terminal of the second control input sub-circuit 202 connected to the second node n2 are turned on, the first voltage signal VH is written into the second node n2, so that the voltage of the second node n2 is at the first level.

For example, the first level and the second level are different, for example, are opposite to each other. In some examples, the first level is a high level and the second level is a low level. However, the present disclosure is not limited to this case, and the first level may be a low level and the second level may be a high level according to actual application requirements. In the description of the present disclosure, the first level as a high level and the second level as a low level are taken as an example.

For example, the first voltage terminal VGH may be a high voltage terminal to output the first voltage signal VH with the first level, and the second voltage terminal VGL may be a low voltage terminal to output the second voltage signal VL with the second level. That is, the first voltage signal VH is a high-level signal (such as 5V, 10V, or other voltages), and the second voltage signal VL is a low-level signal (such as 0V, −1V, or other voltages). For example, in some embodiments, the second voltage terminal VGL may be grounded. For example, both the first voltage signal VH and the second voltage signal VL are DC signals. It should be noted that the low-level signal and the high-level signal are relative, and the voltage value of the low-level signal is less than that of the high-level signal. In different embodiments, the voltage values of high-level signals may be different, and the voltage values of low-level signals may also be different.

It should be noted that the first control circuit 200 may not be connected to the first voltage terminal VGH, but may be connected to an additionally provided voltage terminal, as long as the additionally provided voltage terminal outputs a high voltage signal. In addition, the high voltage signal output from the additionally provided voltage terminal and the high voltage signal output from the first voltage terminal VGH may be the same or different. It should be noted that the first control circuit 200 may not be connected to the first voltage terminal VGH, but may be connected to an additionally provided voltage terminal as long as the additionally provided voltage terminal outputs a high voltage signal. In addition, the high voltage signal output from the additionally provided voltage terminal and the high voltage signal output from the first voltage terminal VGH may be the same or different.

For example, the input circuit 100 includes an input terminal connected to the input voltage terminal ESTV and an output terminal connected to the first node n1. The second control input sub-circuit 202 may be electrically connected to the output terminal of the input circuit 100, that is, to the first node n1, or the second control input sub-circuit 202 may be electrically connected to the input terminal of the input circuit 100, that is, to the input voltage terminal ESVT.

The first bootstrap sub-circuit 203 is electrically connected to the second node n2, the third node n3, and the second clock signal terminal ECB, respectively, and is configured to write a first intermediate signal to the third node n3 under the control of the third control signal Vctr3.

For example, when the voltage of the second node n2 is at the first level, under the control of the voltage of the second node n2, the first bootstrap sub-circuit 203 is in a turn-off state, and the voltage of the third node n3 remains unchanged.

For example, when the voltage of the second node n2 is at the second level, that is, when the third control signal Vctr3 is written into the second node n2, the first bootstrap sub-circuit 203 is in a turn-on state under the control of the voltage of the second node n2, that is, when one terminal of the first bootstrap sub-circuit 203 connected to the second clock signal terminal ECB and the other terminal of the first bootstrap sub-circuit 203 connected to the third node n3 are turned on, the second clock signal VECB is transmitted to the third node n3. When the second clock signal VECB jumps from the first level to the second level, and the voltage of the third node n3 also jumps from the first level to the second level, the first bootstrap sub-circuit 203 generates a bootstrap effect, so that the level of the second node n2 changes with the change of the level of the third node n3, that is, the level of the second node n2 also jumps, and the level of the second node n2 is lower than the second level (for example, at this time, the level of the second node n2 is (2*the first level−the second level)), so that the second clock signal VECB at the second level can be bootstrapped and output via the first bootstrap sub-circuit 203 and written into the third node n3 as the first intermediate signal. That is, the first intermediate signal is the second clock signal VECB at the second level.

The first control output sub-circuit 204 is electrically connected to the second clock signal terminal ECB, the third node n3, and the first output node OP1, respectively, and is configured to write a second intermediate signal Vmid2 determined based on the first intermediate signal into the first output node OP1 under the control of the second clock signal VECB. For example, when the first control output sub-circuit 204 is turned on under the control of the second clock signal VECB, that is, one terminal of the first control output sub-circuit 204 connected to the third node n3 and the other terminal of the first control output sub-circuit 204 connected to the first output node OP1 are turned on, the second intermediate signal Vmid2 determined based on the first intermediate signal is written into the first output node OP1, and the second intermediate signal Vmid2 is also at the second level. For example, a voltage absolute value of the second intermediate signal Vmid2 is less than that of the first intermediate signal, and the voltage absolute value of the signal difference between the first intermediate signal and the second intermediate signal Vmid2 is equal to the absolute value of the threshold voltage of the transistor (for example, the first control output transistor T7 to be described later) in the first control output sub-circuit 204.

The second control output sub-circuit 205 is electrically connected to the first node n1, the first voltage terminal VGH, and the first output node OP1, respectively, and is configured to write the first voltage signal VH to the first output node OP1 under the control of the voltage of the first node n1. For example, when the second control output sub-circuit 205 is turned on under the control of the voltage of the first node n1, that is, when one terminal of the second control output sub-circuit 205 connected to the first voltage terminal VGH and the other terminal of the second control output sub-circuit 205 connected to the first output node OP1 are turned on, the first voltage signal VH is written into the first output node OP1.

For example, the first control signal includes the second intermediate signal Vmid2 and the first voltage signal VH. For example, in the first phase, the first control signal is the second intermediate signal Vmid2, that is, at the second level. Under the control of the second intermediate signal Vmid2, the output circuit 400 achieve to connect the first voltage terminal VGH to the first output terminal Eout, so as to output the first voltage signal VH to the first output terminal Eout. In the second phase, the first control signal is the first voltage signal VH, that is, at the first level. Under the control of the first voltage signal VH, the output circuit 400 disconnects the connection between the first voltage terminal VGH and the first output terminal Eout, thus avoiding outputting the first voltage signal VH to the first output terminal Eout in the second phase.

For example, the holding sub-circuit 206 is electrically connected to the first voltage terminal VGH, the first node n1, and the first output node OP1, respectively, and is configured to maintain a level of the first node in the first phase. For example, in the first phase, the second control signal Vctr2 is the first level signal, and the second output sub-circuit 402 is turned off under the control of the second control signal Vctr2. At this time, the holding sub-circuit 206 is turned on under the control of the voltage of the first output node OP1, that is, one terminal of the holding sub-circuit 206 connected to the first voltage terminal VGH and the other terminal of the holding sub-circuit 206 connected to the first node n1 are turned on, and the first voltage signal VH is written into the first node n1 to control the voltage of the first node n1 to always be at the first level in the first phase, thereby maintaining the second control signal Vctr2 at the first level in the first phase, avoiding circuit fluctuation, and holding the stability of the output.

For example, as shown in FIG. 2A, the second control circuit 300 includes a second bootstrap sub-circuit 301, the second bootstrap sub-circuit 301 is electrically connected to the first node n1, the second clock signal terminal ECB, and the second output node n2, respectively, and is configured to control the voltage of the second output node OP2 under the control of the voltage of the first node n1. For example, due to the bootstrap effect of the second bootstrap sub-circuit 301, the voltage of the second output node OP2 may be lower than the voltage of the second clock signal VECB when the second clock signal VECB is at the second level.

For example, the second control signal Vctr2 includes a first level signal, a second level signal, and a third level signal obtained based on the second clock signal VECB at the second level. For example, the first level signal is the input voltage Vin at the first level, for example, the voltage value of the first level signal is the same as that of the first voltage signal VH, the voltage value of the first level signal is great than that of the second level signal, and the second level signal is obtained based on the input voltage Vin at the second level, for example, the voltage value of the input voltage Vin at the second level is the same as that of the second voltage signal VL, and the voltage absolute value of the second level signal is less than that of the third level signal.

For example, as shown in FIG. 2A, the output circuit 400 includes a first output sub-circuit 401 and a second output sub-circuit 402.

For example, the first output sub-circuit 401 is electrically connected to the first output node n1, the first voltage terminal VGH, and the first output terminal Eout, respectively, and is configured to write the first voltage signal VH to the first output terminal Eout in the first phase under the control of the first control signal Vctr1. For example, in the first phase, the first output sub-circuit 401 is turned on under the control of the first control signal Vctr1, that is, one terminal of the first output sub-circuit 401 connected to the first voltage terminal VGH and the other terminal of the first output sub-circuit 401 connected to the first output terminal Eout are turned on, the first voltage signal VH is written into the first output terminal Eout, and at this time, the second output sub-circuit 402 is turned off under the control of the second control signal Vctr2.

The second output sub-circuit 402 is electrically connected to the second output node OP2, the second voltage terminal VGL, and the first output terminal Eout, respectively, and is configured to write the second voltage signal VL to the first output terminal Eout in the second phase under the control of the second control signal Vctr2. For example, in the second phase, the second output sub-circuit 402 is turned on under the control of the second control signal Vctr2, that is, one terminal of the second output sub-circuit 402 connected to the second voltage terminal VGL and the other terminal of the second output sub-circuit 402 connected to the first output terminal Eout are turned on, the second voltage signal VL is written into the first output terminal Eout, and at this time, the first output sub-circuit 401 is turned off under the control of the first control signal Vctr1.

For example, the first output signal further includes a third voltage signal, and the output circuit 400 is further configured to write the third voltage signal VL1 obtained based on the second voltage signal VL into the first output terminal Eout in the second phase under the control of the first control signal Vctr1 and the second control signal Vctr2. For example, a voltage absolute value of the third voltage signal VL1 is less than that of the second voltage signal VL. Due to the threshold loss of the low-level signal output by the P-type transistor, the second output sub-circuit 402 may write the third voltage signal VL1 obtained based on the second voltage signal VL into the first output terminal Eout. The voltage absolute value of the signal difference between the second voltage signal VL and the third voltage signal VL1 is equal to the absolute value of the threshold voltage of the transistor in the second output sub-circuit 402 (for example, the second output transistor T10 to be described later).

For example, the voltage absolute value of the third level signal included in the second control signal Vctr2 is greater than that of the second voltage signal VL, so that the second output sub-circuit 402 can output the second voltage signal VL without threshold voltage loss to the first output terminal Eout. In the second phase, the first output signal Vout includes the third voltage signal VL1 and the second voltage signal VL, and finally the first output signal Vout remains in the state of the second voltage signal VL.

Figure 2B:
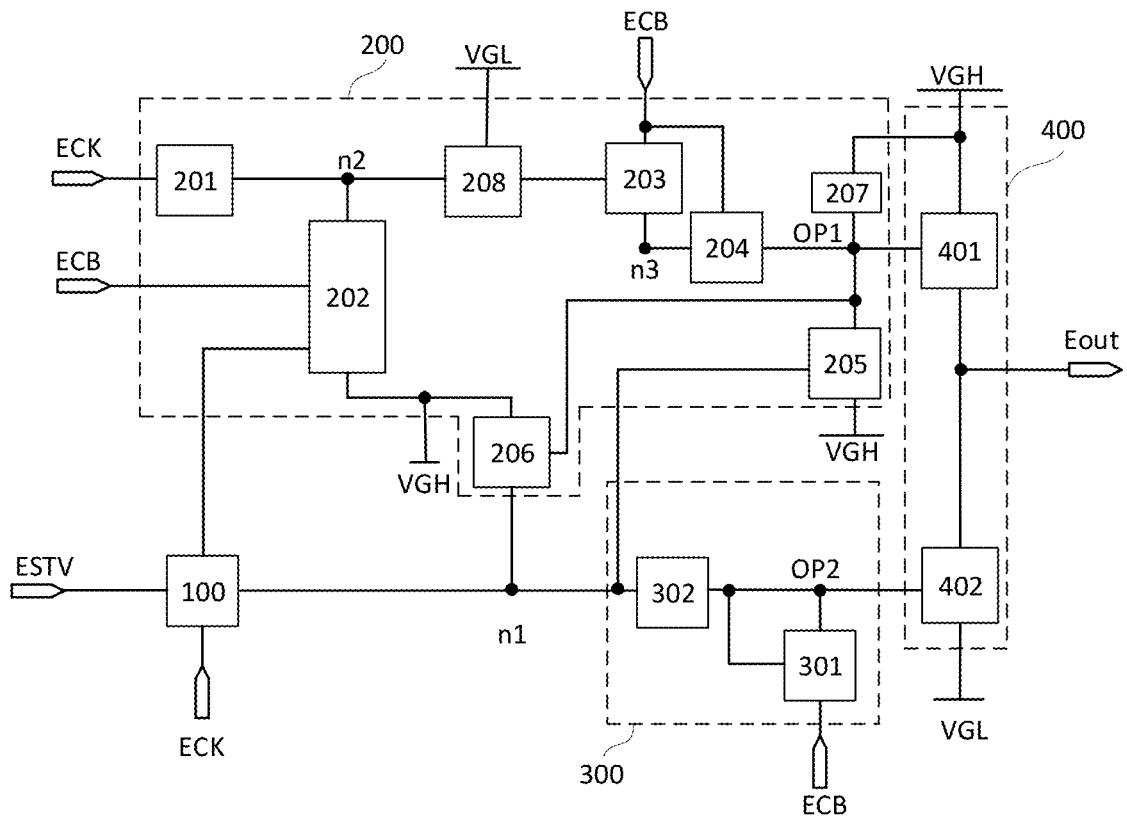
FIG. 2B is a schematic block diagram of another shift register provided by at least one embodiment of the present disclosure.

FIG. 2B is a schematic block diagram of another shift register provided by at least one embodiment of the present disclosure.

As shown in FIG. 2B, the shift register includes an input circuit 100, a first control circuit 200, a second control circuit 300, and an output circuit 400. Compared with the shift register shown in FIG. 2A, the first control circuit 200 of the shift register shown in FIG. 2B also includes a storage sub-circuit 207, a first isolation sub-circuit 208, and the second control circuit 300 further includes a second isolation sub-circuit 302. Other sub-circuits of the shift register shown in FIG. 2B are the same as those of the shift register shown in FIG. 2A, and the repetition will not be repeated here.

For example, the storage sub-circuit 207 is electrically connected to the first voltage terminal VGH and the first output node OP1, respectively, and is configured to store the voltage of the first output node OP1.

For example, the first control circuit 200 is also electrically connected to the second voltage terminal VGL, an input terminal of the first isolation sub-circuit 208 is electrically connected to the second node n2, an output terminal of the first isolation sub-circuit 208 is electrically connected to the first bootstrap sub-circuit 203, and a control terminal of the first isolation sub-circuit 208 is electrically connected to the second voltage terminal VGL. For example, in general, the first isolation sub-circuit 208 is in a turn-on state, that is, one terminal of the first isolation sub-circuit 208 connected to the second node n2 and the other terminal of the first isolation sub-circuit 208 connected to the first bootstrap sub-circuit 203 are turned on. When the voltage of the first bootstrap sub-circuit 203 fluctuates, for example, when the voltage of one terminal of the first isolation sub-circuit 208 connected to the first bootstrap sub-circuit 203 suddenly drops, the first isolation sub-circuit 208 is switched from the turn-on state to the turn-off state, so as to avoid the situation where the voltage of the second node n2 fluctuates accordingly and thus affects the performance of the transistor in the second control input sub-circuit 202 (for example, the first pull-up transistor T2 described below).

It should be noted that the first control circuit 200 may not be connected to the second voltage terminal VGL, but may be connected to an additionally provided voltage terminal so long as the additionally provided voltage terminal outputs a low voltage signal. In addition, the low voltage signal output by the additionally provided voltage terminal and the low voltage signal output by the second voltage terminal VGL may be the same or different.

For example, the second control circuit further includes the second isolation sub-circuit 302, an input terminal of the second isolation sub-circuit 302 is electrically connected to the first node n1, an output terminal of the second isolation sub-circuit 302 is electrically connected to the second bootstrap sub-circuit 301 and the second output node OP2, and a control terminal of the second isolation sub-circuit 302 is electrically connected to the second voltage terminal VGL. For example, in general, the second isolation sub-circuit 302 is in a turn-on state, that is, one terminal of the second isolation sub-circuit 302 connected to the first node n1 and the other terminal of the second isolation sub-circuit 302 connected to the second bootstrap sub-circuit 301 are turned on. When the voltage of the second bootstrap sub-circuit 301 fluctuates, for example, due to the bootstrap effect of the second bootstrap sub-circuit 301, the voltage at one terminal of the second isolation sub-circuit 302 connected to the second bootstrap sub-circuit 301 will suddenly drop, and at this time, the second isolation sub-circuit 302 is switched from the turn-on state to the turn-off state, thus preventing the voltage of the first node n1 from fluctuating accordingly and avoiding the abnormal output. For example, when the second control input sub-circuit 202 is connected to the first node n1, if the voltage of the first node n1 drops along with the change of the voltage of the second output node OP2, the second control input sub-circuit 202 may be turned on, resulting in the abnormal output.

For example, in the present disclosure, all transistors (transistors T1-T18 to be described below) are P-type transistors.

Figure 3A:
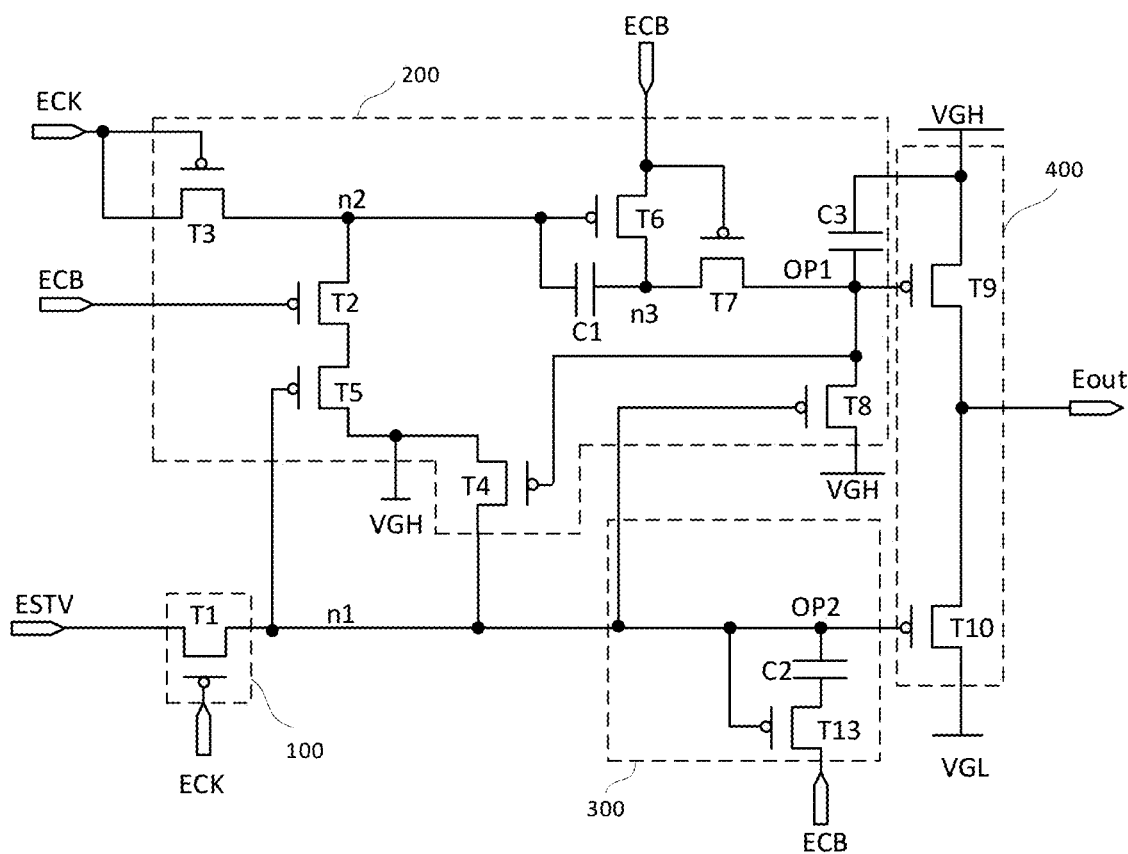
FIG. 3A is a structural schematic diagram of a shift register provided by at least one embodiment of the present disclosure.

FIG. 3A is a structural schematic diagram of a shift register according to an embodiment of the present disclosure. The circuit structure diagram shown in FIG. 3A is a specific example of the schematic block diagram of the shift register shown in FIG. 2A.

As shown in FIG. 3A, the first control input sub-circuit 201 includes a first pull-down transistor T3, a first electrode of the first pull-down transistor T3 is electrically connected to the first clock signal terminal ECK, a second electrode of the first pull-down transistor T3 is electrically connected to the second node n2, and a gate electrode of the first pull-down transistor T3 is electrically connected to the first clock signal terminal ECK.

The second control input sub-circuit 202 includes a first pull-up transistor T2 and a second pull-up transistor T5. A first electrode of the first pull-up transistor T2 is electrically connected to a second electrode of the second pull-up transistor T5, a second electrode of the first pull-up transistor T2 is electrically connected to the second node n2, a gate electrode of the first pull-up transistor T2 is electrically connected to the second clock signal terminal ECB, a first electrode of the second pull-up transistor T5 is electrically connected to the first voltage terminal VGH, and a gate electrode of the second pull-up transistor T5 is electrically connected to the output terminal of the input circuit 11, that is, connected to the first node n1.

The first bootstrap sub-circuit 203 includes a first capacitor C1 and a first bootstrap transistor T6, a gate electrode of the first bootstrap transistor T6 is electrically connected to the second node n2 and a first terminal of the first capacitor C1, a second electrode of the first bootstrap transistor T6 is electrically connected to a second terminal of the first capacitor C1 and the third node n3, and a first electrode of the first bootstrap transistor T6 is electrically connected to the second clock signal terminal ECB.

The first control output sub-circuit 204 includes a first control output transistor T7, a gate electrode of the first control output transistor T7 is electrically connected to the second clock signal terminal ECB, a first electrode of the first control output transistor T7 is electrically connected to the third node n3, and a second electrode of the first control output transistor T7 is electrically connected to the first output node OP1.

The second control output sub-circuit 205 includes a second control output transistor T8, a gate electrode of the second control output transistor T8 is electrically connected to the first node n1, a first electrode of the second control output transistor T8 is electrically connected to the first voltage terminal VGH, and a second electrode of the second control output transistor T8 is electrically connected to the first output node OP1.

The holding sub-circuit 206 includes a holding transistor T4, a first electrode of the holding transistor T4 is electrically connected to the first voltage terminal VGH, a second electrode of the holding transistor T4 is electrically connected to the first node n1, and a gate electrode of the holding transistor T4 is electrically connected to the first output node OP1.

The storage sub-circuit 207 includes a storage capacitor C3, a first terminal of the storage capacitor C3 is electrically connected to the first voltage terminal VGH, and a second terminal of the storage capacitor C3 is electrically connected to the first output node OP1.

The second bootstrap sub-circuit 301 includes a second capacitor C2 and a second bootstrap transistor T13, a first electrode of the second bootstrap transistor T13 is electrically connected to the second clock signal terminal ECB, a first terminal of the second capacitor C2 is electrically connected to a gate electrode of the second bootstrap transistor T13 and the second output node OP2, and a second terminal of the second capacitor C2 is electrically connected to a second electrode of the second bootstrap transistor T13.

The first output sub-circuit 401 includes a first output transistor T9, a gate electrode of the first output transistor T9 is electrically connected to the first output node OP1, a first electrode of the first output transistor T9 is electrically connected to the first voltage terminal VGH, and a second electrode of the first output transistor T9 is electrically connected to the first output terminal Eout.

The second output sub-circuit 402 includes a second output transistor T10, a gate electrode of the second output transistor T10 is electrically connected to the second output node OP2, a first electrode of the second output transistor T10 is electrically connected to the second voltage terminal VGL, and a second electrode of the second output transistor T10 is electrically connected to the first output terminal Eout.

For example, the input circuit 100 is used to transmit the input voltage Vin to the first node n1 to trigger the shift register to work. As shown in FIG. 3A, the input circuit 100 includes an input transistor T1. A first electrode of the input transistor T1 is electrically connected to the input voltage terminal ESTV, a second electrode of the input transistor T1 is electrically connected to the first node n1, and a gate electrode of the input transistor T1 is electrically connected to the first clock signal terminal ECK.

Figure 3B:
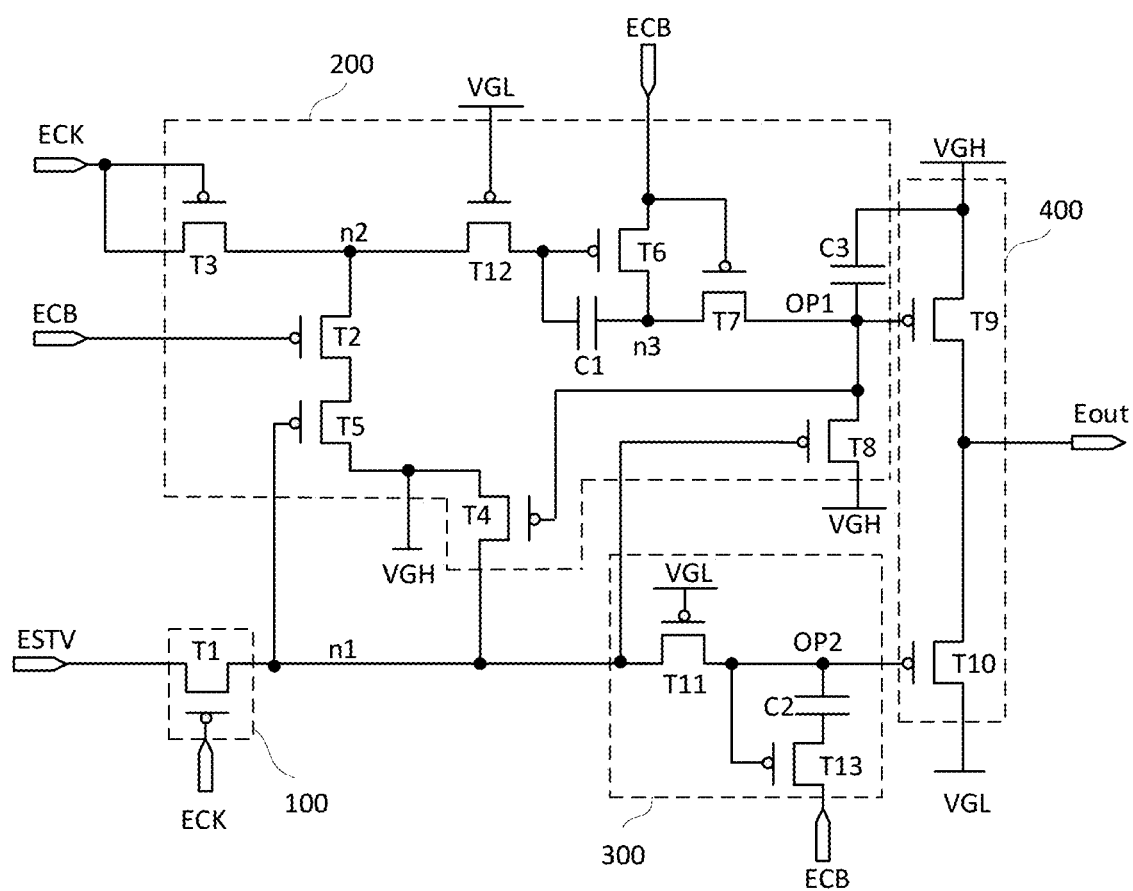
FIG. 3B is a structural schematic diagram of another shift register provided by at least one embodiment of the present disclosure.

FIG. 3B is a structural schematic diagram of another shift register provided by an embodiment of the present disclosure. The circuit structure diagram shown in FIG. 3B is a specific example of the schematic block diagram of the shift register shown in FIG. 2B. The shift register shown in FIG. 2B further includes the first isolation sub-circuit 208 and the second isolation sub-circuit 302.

For example, as shown in FIG. 3B, the first isolation sub-circuit 208 includes a first isolation transistor T12, a first electrode of the first isolation transistor T12 is electrically connected to the second node n2, a gate electrode of the first isolation transistor T12 is electrically connected to the second voltage terminal VGL, and a second electrode of the first isolation transistor T12 is electrically connected to the first bootstrap sub-circuit 203. For example, as shown in FIG. 3B, the second electrode of the first isolation transistor T12 is electrically connected to the gate electrode of the first bootstrap transistor T6.

The second isolation sub-circuit 302 includes a second isolation transistor T11, a first electrode of the second isolation transistor T11 is electrically connected to the first node n1, a second electrode of the second isolation transistor T11 is electrically connected to the second output node OP2, and a gate electrode of the second isolation transistor T11 is electrically connected to the second voltage terminal VGL.

Figure 3C:
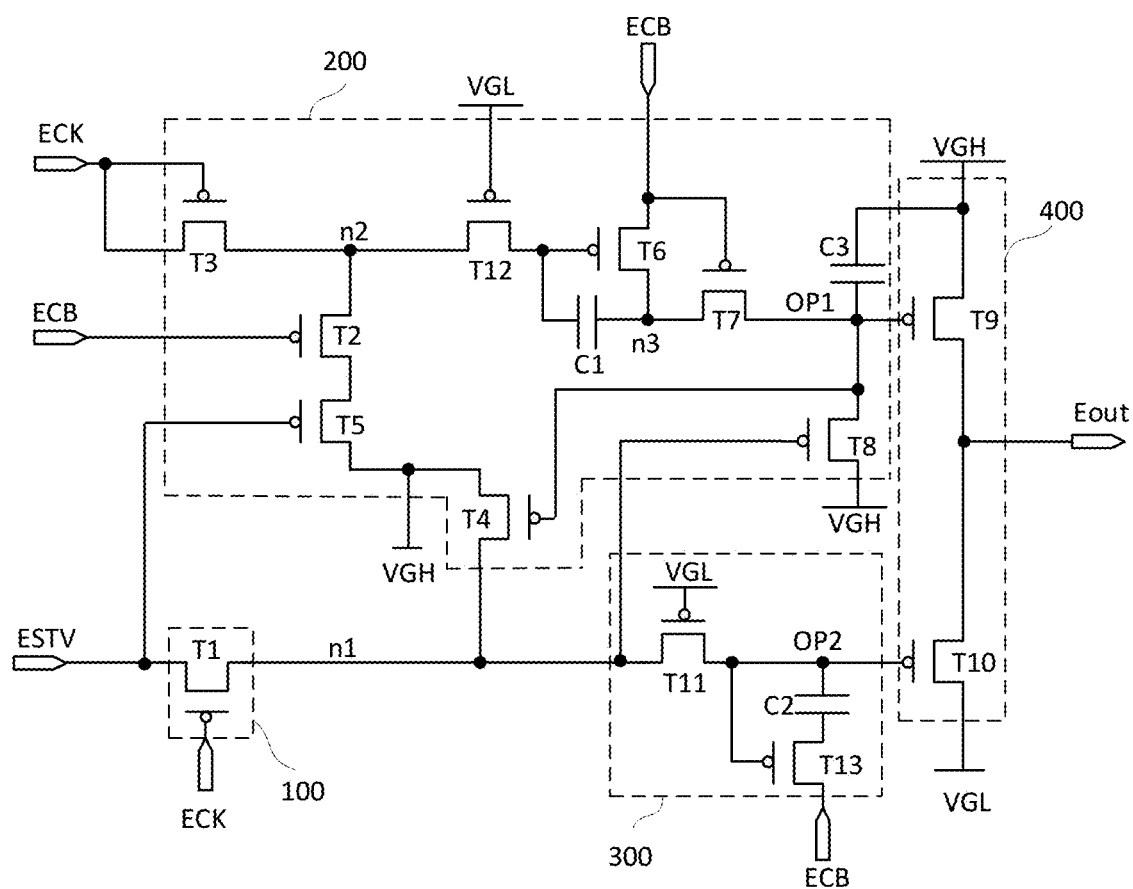
FIG. 3C is a structural schematic diagram of another shift register provided by at least one embodiment of the present disclosure.

FIG. 3C is a structural schematic diagram of another shift register provided in an embodiment of the present disclosure. The circuit structure diagram shown in FIG. 3C is another specific example of the schematic block diagram of the shift register shown in FIG. 2B.

For example, the difference between the circuit structure diagram shown in FIG. 3B and the circuit structure diagram shown in FIG. 3C is that the gate electrode of the second pull-up transistor T5 of the shift register shown in FIG. 3B is electrically connected to the first node n1, and the gate electrode of the second pull-up transistor T5 of the shift register shown in FIG. 3C is electrically connected to the input voltage terminal ESTV. The connection relationship between other circuit structures can refer to the description of the structure of the shift register shown in FIGS. 3A and 3B, which will not be repeated here.

For example, when the second pull-up transistor T5 is electrically connected to the input voltage terminal ESTV, the input voltage Vin can directly control the turn-on and turn-off of the second pull-up transistor T5, so that the second pull-up transistor T5 can be turned off in advance under the control of the high level of the input voltage Vin before the input phase.

In addition, it should be noted that the input circuit 100, the first control circuit 200, the second control circuit 300, and the output circuit 400 shown in FIGS. 3A, 3B, and 3C are only one example of the embodiments of the present disclosure, and the embodiments of the present disclosure include but are not limited to the situations shown in FIGS. 3A, 3B, and 3C.

For example, the high level of the first clock signal VECK and the high level of the second clock signal VECB are the same as the level of the first voltage signal VH, and the low level of the first clock signal VECK and the low level of the second clock signal VECB are the same as the level of the second voltage signal VL.

It should be noted that the high level of the first clock signal VECK and the high level of the second clock signal VECB may also be different from the level of the first voltage signal VH, and the low level of the first clock signal VECK and the low level of the second clock signal VECB may also be different from the level of the second voltage signal VL, so long as the first clock signal VECK and the second clock signal VECB can perform their own functions, and the present disclosure is not limited to this case. In the embodiment of the present disclosure, the shift register provided by the present disclosure is described by taking a case that the high level of the first clock signal VECK and the high level of the second clock signal VECB are the same level as the first voltage signal VH, and the low level of the first clock signal VECK and the low level of the second clock signal VECB are the same level as the second voltage signal VL as an example.

Figure 3D:
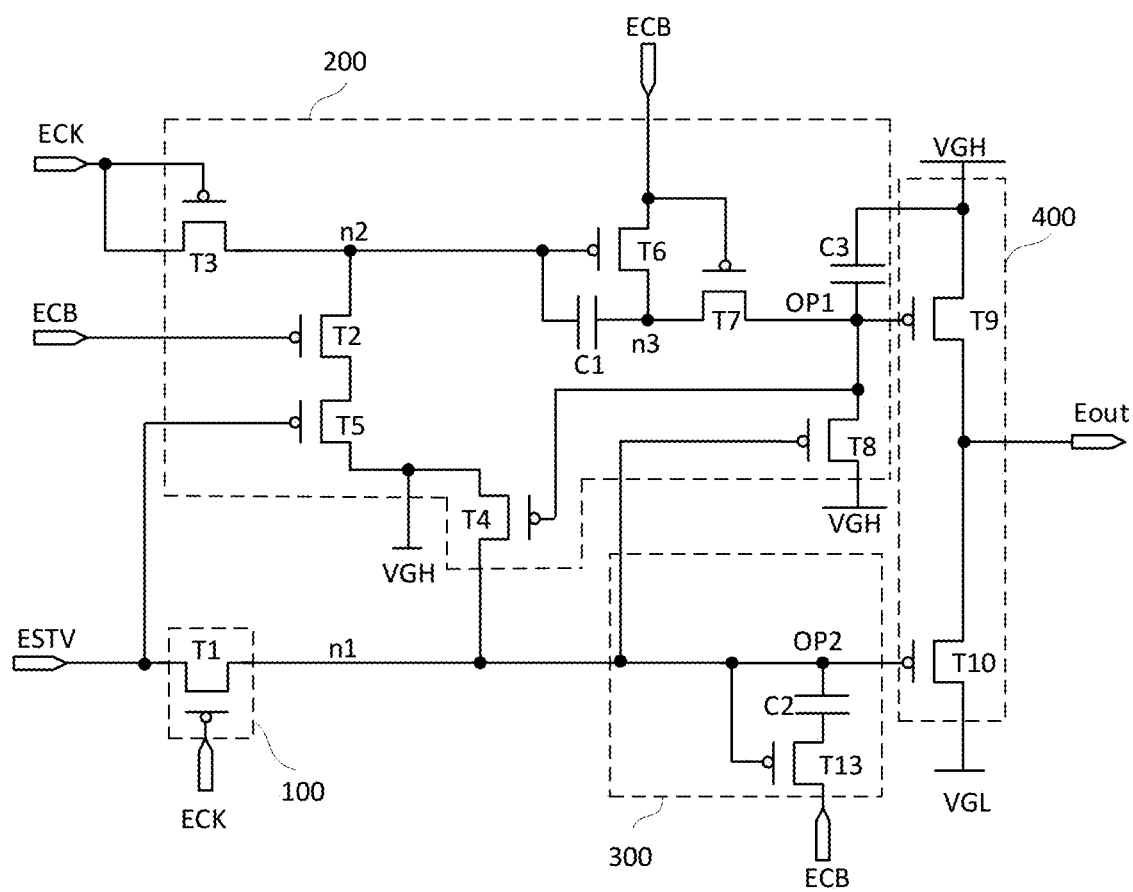
FIG. 3D is a structural schematic diagram of another shift register provided by at least one embodiment of the present disclosure.

FIG. 3D is a structural schematic diagram of another shift register provided by at least one embodiment of the present disclosure. The circuit structure diagram shown in FIG. 3D is another specific example of the schematic block diagram of the shift register shown in FIG. 2A.

For example, the difference between the circuit structure diagram shown in FIG. 3D and the circuit structure diagram shown in FIG. 3A is that the gate electrode of the second pull-up transistor T5 of the shift register shown in FIG. 3A is electrically connected to the first node n1, and the gate electrode of the second pull-up transistor T5 of the shift register shown in FIG. 3D is electrically connected to the input voltage terminal ESTV. The connection relationship between other circuit structures can refer to the description of the structure of the shift register shown in FIG. 3A for, which will not be repeated here.

Figure 4A:
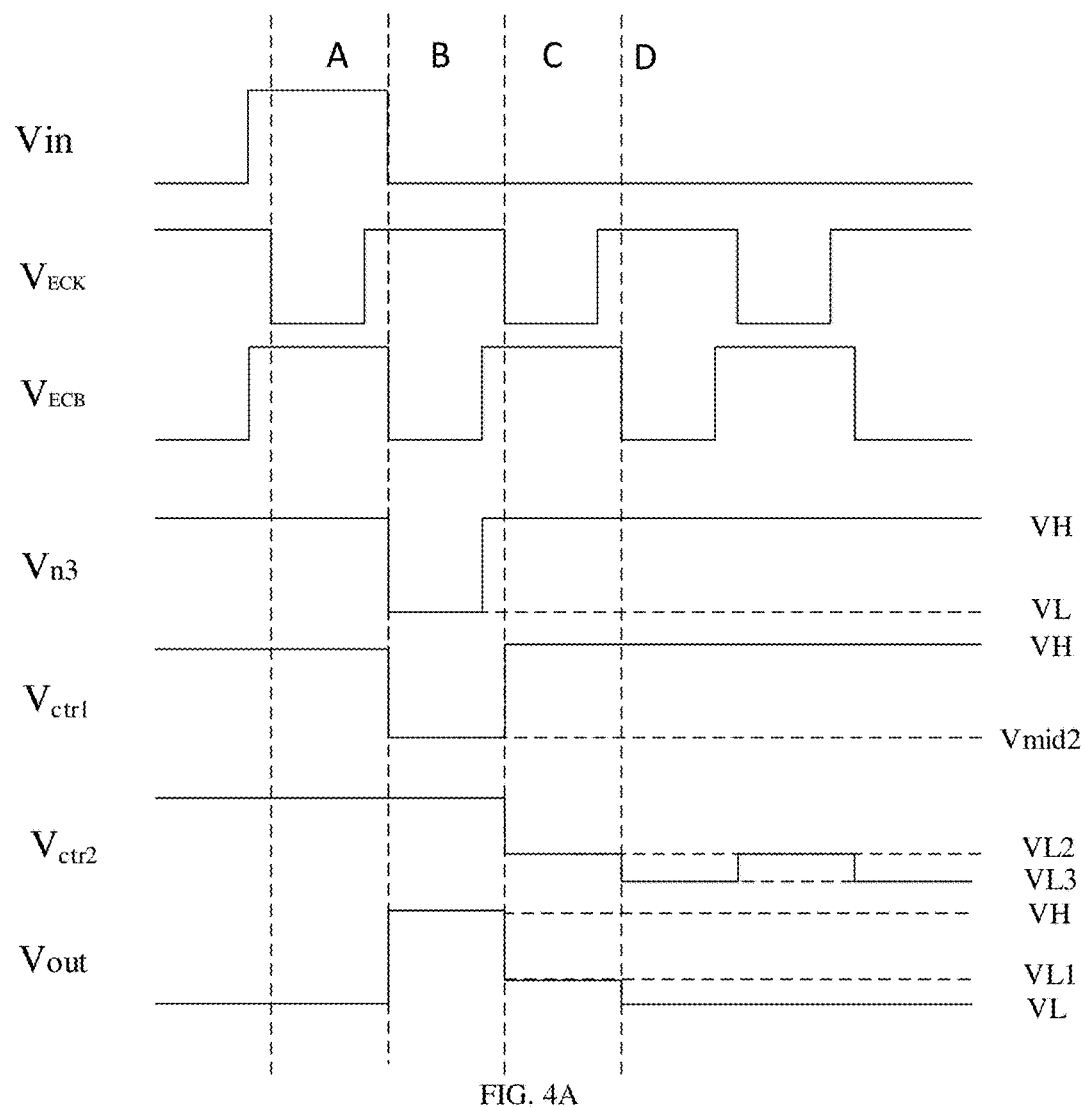
FIG. 4A is a driving timing diagram of a shift register provided by at least one embodiment of the present disclosure.

FIG. 4A is a driving timing diagram of a shift register according to an embodiment of the present disclosure. The working principle of the shift register provided by the embodiment of the present disclosure is described below by taking the shift register shown in FIG. 3B and the driving timing shown in FIG. 4A as examples.

For example, as shown in FIG. 4A, the working process of the shift register provided by the embodiment of the present disclosure includes an input phase A, a first phase B, a buffer phase C, and a stabilization phase D, and the input phase A, the buffer phase C, and the stabilization phase D belong to the second phase.

For example, as shown in FIG. 4A, the high-level input voltage Vin, the high-level first clock signal VECK, and the high-level second clock signal VECB are all equal to the first voltage signal VH, and the low-level input voltage Vin, the low-level first clock signal VECK, and the low-level second clock signal VECB are all equal to the second voltage signal VL.

For example, as shown in FIG. 4A, Vout represents the first output signal, Vn3 represents the voltage of the third node n3, Vctr1 represents the first control signal, and Vctr2 represents the second control signal.

For example, the first isolation transistor T12 is in a normally turn-on state under the control of the second voltage signal VL, and the second isolation transistor T11 is also in a normally turn-on state under the control of the second voltage signal VL.

In the input phase A, the input voltage Vin is input to the first node n1. For example, as shown in FIGS. 4A and 3B, in the input phase A, the first clock signal VECK output by the first clock signal terminal ECK is a low-level signal, the second clock signal VECB output by the second clock signal terminal ECB is a high-level signal, and the input voltage Vin output by the input voltage terminal ESTV is a high-level signal.

Because the first clock signal VECK is a low-level signal, the input transistor T1 is turned on, the input voltage Vin (high-level signal) is transmitted to the first node n1 via the input transistor T1, and the second isolation transistor T11 is also turned on, so that the input voltage Vin is also transmitted to the second output node OP2 via the second isolation transistor T11, so that both the first node n1 and the second output node OP2 are at a high level. The second control signal Vctr2 includes a first level signal, the first level signal is the voltage of the second output node OP2 in the input phase A, that is, the input voltage Vin. Because the input voltage Vin is equal to the voltage of the first voltage signal VH, that is, the first level signal is the first voltage signal VH, that is, the second control signal Vctr2 is the first voltage signal VH.

Under the control of the high level of the first node n1 and the high level of the second output node OP2, the second pull-up transistor T5, the second control output transistor T8, the second output transistor T10, and the second bootstrap transistor T13 are all in the turn-off state. Because the second clock signal VECB is a high-level signal, both the first pull-up transistor T2 and the first output control transistor T7 are in the turn-off state under the control of the high level of the second clock signal VECB.

Because both the first pull-up transistor T2 and the second pull-up transistor T5 are in the turn-off state, the voltage of the second node n2 will not be affected by the first voltage terminal VGH. At this time, the first pull-down transistor T3 is in a turn-on state under the control of the low level of the first clock signal VECK, and the low level of the first clock signal VECK is transmitted to the second node n2 via the first pull-down transistor T3, so that the second node n2 is at a low level. Because the first pull-down transistor T3 has a threshold loss when transmitting a low-level signal, the voltage of the second node n2 is VECK1−Vth3, where Vth3 represents the threshold voltage of the first pull-down transistor T3, VECK1 is the first clock signal VECK at a low level, VECK1=VL, that is, the voltage of the second node n2 is VL-Vth3. Because the first isolation transistor T12 is turned on, the voltage of the second node n2 is transmitted to the gate electrode of the first bootstrap transistor T6 via the first isolation transistor T12, so that the gate electrode of the first bootstrap transistor T6 is also at a low level. For example, the threshold voltage of the first isolation transistor T12 is denoted as Vth12. Similarly, because the first isolation transistor T12 has a threshold loss when transmitting a low-level signal, the voltage of the gate electrode of the first bootstrap transistor T6 is VL-VthN, where VthN is the smaller one of the threshold voltage Vth3 and the threshold voltage Vth12.

The voltage VL-VthN received by the gate electrode of the first bootstrap transistor T6 can control the first bootstrap transistor T6 to be turned on, and the high-level signal of the second clock signal VECB is written into the third node n3 via the first bootstrap transistor T6, so that the third node n3 is at a high level. For example, the voltage Vn3 of the third node N3 is the second clock signal VECB at a high level, that is, the first voltage signal VH, in the input phase A.

Because both the first control output transistor T7 and the second control output transistor T8 are in the turn-off state, the voltage of the first output node OP1 remains unchanged, and the first control signal Vctr1 is a high-level signal, that is, the gate voltage of the first output transistor T9 maintains the state of the previous phase and is still at a high level, so that the first output terminal Eout still maintains the state of the previous phase and remains unchanged, and the first output signal Vout is still a low-level signal.

In the first phase B, under the control of the first control signal Vctr1, the first voltage signal VH is output to the first output terminal Eout. For example, as shown in FIGS. 4A and 3B, in the first phase B, the first clock signal VECK output by the first clock signal terminal ECK is a high-level signal, the second clock signal VECB output by the second clock signal terminal ECB is a low-level signal, and the input voltage Vin output by the input voltage terminal ESTV is a low-level signal.

Because the first clock signal VECK is a high-level signal, the input transistor T1 is turned off, and the voltage of the first node n1 and the voltage of the second output node OP2 remain unchanged, that is, the voltage of the first node n1 and the voltage of the second output node OP2 are still the first voltage signal VH. At this time, the second control signal Vctr2 is still the first level signal, and the second pull-up transistor T5, the second control output transistor T8, the second output transistor T10, and the second bootstrap transistor T13 are all still in the turn-off state under the control of the high level of the first node n1 and the high level of the second output node OP2.

Because the first clock signal VECK is a high-level signal, the first pull-down transistor T3 is in a turn-off state. Although the first pull-up transistor T2 is in a turn-on state under the control of the second clock signal VECB, the voltage of the second node n2 remains unchanged because the second pull-up transistor T5 is in a turn-off state, that is, the voltage of the second node n2 is still VL-Vth3.

The first bootstrap transistor T6 is still turned on, and the low-level signal of the second clock signal VECB (i.e., the second voltage signal VL) is written into the third node n3 via the first bootstrap transistor T6, so that the voltage Vn3 of the third node n3 jumps from a high level to a low level. Due to the coupling effect of the first capacitor C1, when the voltage Vn3 of the third node n3 jumps from a high level to a low level, the voltage of the gate electrode of the first bootstrap transistor T6 also jumps, and the voltage of the gate electrode of the first bootstrap transistor T6 jumps to VL-VthN-ΔV, where ΔV represents the potential difference between the high level and the low level, and VL-VthN-ΔV is less than VL-VthN, so that the voltage of the gate electrode of the first bootstrap transistor T6 becomes lower, and thus the first bootstrap transistor T6 can be turned on better, so that the low-level second clock signal VECB can be transmitted to the third node n3 without threshold loss, that is, the voltage of the third node n3 is the low-level second clock signal VECB, that is, the second voltage signal VL, the low-level second clock signal VECB is the first intermediate signal, that is, the first intermediate signal is the second voltage signal VL.

The first control output transistor T7 is turned on under the control of the low-level signal of the second clock signal VECB, and writes the second intermediate signal Vmid2 determined based on the first intermediate signal into the first output node OP1. Because the first control output transistor T7 has a threshold loss when transmitting a low-level signal, so the voltage of the second intermediate signal Vmid2 is VL-Vth7, where Vth7 represents the threshold voltage of the first control output transistor T7, that is, in the first phase B, the voltage of the first output node OP1 is VL-Vth7, and the first control signal Vctr1 is the second intermediate signal Vmid2, namely VL-Vth7.

The first control signal Vctr1 is the second intermediate signal Vmid2, and the second intermediate signal Vmid2 is a low-level signal. Therefore, in the first phase B, under the control of the first control signal Vctr1 (i.e., the second intermediate signal Vmid2), the first output transistor T9 and the holding transistor T4 are turned on, and the first voltage signal VH is written into the first output terminal Eout through the first output transistor T9 to complete the output of the high-level. At this time, the first output signal Vout is the first voltage signal VH. The first voltage signal VH is written into the first node n1 via the holding transistor T4 to maintain the high level of the first node, thereby preventing the second pull-up transistor T5 from being turned on by mistake in the first phase B.

In the buffer phase C, under the control of the voltage of the second output node OP2, the third voltage signal VL1 obtained based on the second voltage signal VL is output to the first output terminal Eout.

For example, as shown in FIGS. 4A and 3B, in the buffer phase C, the first clock signal VECK output by the first clock signal terminal ECK is a low-level signal, the second clock signal VECB output by the second clock signal terminal ECB is a high-level signal, and the input voltage Vin output by the input voltage terminal ESTV is a low-level signal.

The first pull-down transistor T3 is turned on under the control of the low level of the first clock signal VECK, and the low-level first clock signal VECK is transmitted to the second node n2 via the first pull-down transistor T3, so that the second node n2 is kept at a low level. At the same time, because the first isolation transistor T12 is turned on, the voltage of the second node n2 is transmitted to the gate electrode of the first bootstrap transistor T6 via the first isolation transistor T12, so that the gate electrode of the first bootstrap transistor T6 is also at a low level, and therefore, the first bootstrap transistor T6 is in a turn-on state, and writes the high level of the second clock signal VECB into the third node n3, so that the third node n3 is at a high level, that is, the voltage Vn3 of the third node n3 is the second clock signal VECB at a high level.

The first control output transistor T7 is turned off under the control of the high level of the second clock signal VECB, the input transistor T1 is turned on under the control of the low level of the first clock signal VECK, the low-level input voltage Vin is transmitted to the first node n1 via the input transistor T1, so that the first node n1 is at a low level, the second control output transistor T8 is turned on under the control of the voltage of the first node n1. The first voltage signal VH is transmitted to the first output node OP1 via the second control output transistor T8 and charges the storage capacitor C3, so that the first output node OP1 is at a high level, that is, at this time, the first control signal Vctr1 is the first voltage signal VH, and both the first output transistor T9 and the holding transistor T4 are in the turn-off state under the control of the first control signal Vctr1.

Because the first clock signal VECK is a low-level signal, the input transistor T1 is turned on, the low-level VL of the input voltage Vin is transmitted to the first node n1 via the input transistor T1, and the second isolation transistor T11 is also turned on, so that the input voltage Vin is also transmitted to the second output node OP2 via the second isolation transistor T11, so that both the first node n1 and the second output node OP2 are at a low level. Because the input transistor T1 has a threshold loss when transmitting a low-level signal, the voltage of the first node n1 is Vin-Vth1, namely VL-Vth1, where Vth1 represents the threshold voltage of the input transistor T1. For example, the threshold voltage of the second isolation transistor T11 is represented as Vth11. Similarly, because the second isolation transistor T11 has a threshold loss when transmitting a low-level signal, the voltage of the second output node OP2 is VL-VthM, where VthM is the smaller one of Vth1 and Vth11. The second control signal Vctr2 includes a second level signal (VL2 shown in FIG. 4A), the second level signal VL2 is the voltage of the second output node OP2 in the input phase C, namely VL-VthM, that is, the level of VL2 shown in FIG. 4A is VL-VthM.

Under the control of the low level of the first node n1 and the low level of the second output node OP2, the second pull-up transistor T5, the second control output transistor T8, the second output transistor T10, and the second bootstrap transistor T13 are all in a turn-on state. The first pull-up transistor T2 and the first output control transistor T7 are both in the turn-off state under the control of the high level of the second clock signal VECB.

In the buffer phase C, the second output transistor T10 is in a turn-on state under the control of the low level of the second control signal Vctr2 (i.e., the second level signal VL2), and the second voltage signal VL is transmitted to the first output terminal Eout via the second output transistor T10. Because the low-level signal transmitted by the second output transistor T10 has a threshold loss, the second voltage signal VL cannot be completely output to the first output terminal Eout. At this time, the signal of the first output terminal Eout is the third voltage signal VL1, and the voltage of the third voltage signal VL1 is VL−Vth10−VthM, where Vth10 represents the threshold voltage of the second output transistor T10.

In the stabilization phase D, under the control of the voltage of the second output node OP2, the second voltage signal VL is output to the first output terminal Eout, so that the first output signal Vout is finally reduced from the third voltage signal VL1 to the second voltage signal VL.

For example, as shown in FIGS. 4A and 3B, in the stabilization phase D, the first clock signal VECK output by the first clock signal terminal ECK is a high-level signal, the second clock signal VECB output by the second clock signal terminal ECB is a low-level signal, and the input voltage Vin output by the input voltage terminal ESTV is a low-level signal.

Because the first clock signal VECK is a high-level signal, the input transistor T1 is turned off, and the voltage of the first node n1 and the voltage of the second output node OP2 remain unchanged at the low level of the buffer phase C. The second pull-up transistor T5 and the second control output transistor T8 are in a turn-on state under control of the low level of the first node n1, and the second output transistor T10 and the second bootstrap transistor T13 are in a turn-on state under control of the low level of the second output node OP2.

The first pull-up transistor T2 is also turned on under the control of the low level of the second clock signal VECB, and the first voltage signal VH is transmitted to the second node n2 via the first pull-up transistor T2 and the second pull-up transistor T5, so that the second node n2 is at a high level, and the voltage of the second node n2 is transmitted to the gate electrode of the first bootstrap transistor T6 via the first isolation transistor T12, so that the first bootstrap transistor T6 is turned off, and the first control output transistor T7 is also turned on under the control of the low level of the second clock signal VECB.

The first voltage signal VH is transmitted to the first output node OP1 via the second control output transistor T8, and charges the storage capacitor C3 to keep the first output node OP1 to be at a high level. At this time, the first control signal Vctr1 is the first voltage signal VH, and both the first output transistor T9 and the holding transistor T4 are in the turn-off state under the control of the first control signal Vctr1.

Because the second bootstrap transistor T13 is in the turn-on state, the input transistor T1 and the holding transistor T4 are in the turn-off state, and the voltage of the second output node OP2 is only affected by the second capacitor C2. From the buffer phase C to the stabilization phase D, the second clock signal VECB has a voltage jump from a high level to a low level. Because the second bootstrap transistor T13 is turned on, the voltage at the second terminal of the second capacitor C2 also has a jump from a high level to a low level. Under the coupling effect of the second capacitor C2, the voltage at the first terminal of the second capacitor C2, that is, the second output node OP2, jumps, so that the voltage at the second output node OP2 drops even lower. Under the control of the voltage of the second output node OP2, the second bootstrap transistor T13 is fully turned on, so that the low-level second clock signal VECB can be transmitted, without threshold loss, to the second terminal of the second capacitor C2 through the second bootstrap transistor T13. It can be seen that at this time, the voltage of the second terminal of the second capacitor C2 jumps from the high-level second clock signal VECB (i.e. the first voltage signal VH) to the low-level second clock signal VECB (the second voltage signal VL), and the voltage difference of the voltage jump is VH-VL. At this time, the second control signal Vctr2 is the third level signal (i.e., VL3 shown in FIG. 4A), the voltage of the second output node OP2 jumps from the second level signal VL2 to the third level signal VL3, and the voltage of the third level signal VL3 is (VL−VthM−ΔV), that is, the level of VL3 shown in FIG. 4A is (VL−VthM−ΔV), and the voltage absolute difference between the third level signal VL3 and the second level signal VL2 is the voltage difference of the voltage jump.

At this time, because the third level signal is lower than the second level signal, the second output transistor T10 can be turned on better, so that the second voltage signal VL can be output to the first output terminal Eout without threshold loss. At this time, the first output signal Vout can reach the second voltage signal VL.

Then, before the next high level of the input voltage Vin comes, the voltage of the first node n1 is kept at a low level, so the second pull-up transistor T8 is always turned on, thus maintaining the high level of the first output node OP1, and the first output transistor T9 is always turned off. In addition, under the control of the second clock signal VECB, the voltage of the second output node OP2 is periodically pulled down, that is, the second control signal Vctr2 periodically changes between the second voltage signal VL2 and the third voltage signal VL3, so as to ensure that the first output signal Vout remains at the low level of the second voltage signal VL, and the whole circuit continuously maintains the output state of the stabilization phase D, and the subsequent phases will not be described in detail.

It should be noted that, in the embodiments of the present disclosure, the first control signal Vctr1 includes the voltage of the first output node OP1 in respective phases (i.e., the input phase A, the first phase B, the buffer phase C, and the stabilization phase D), and the second control signal Vctr2 includes the voltage of the second output node OP2 in the respective phases.

Figure 4B:
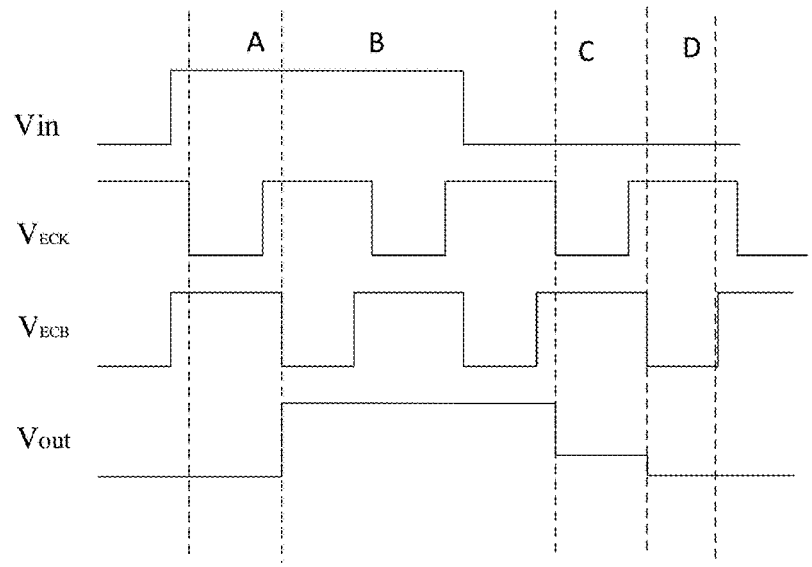
FIG. 4B is a driving timing diagram of another shift register provided by at least one embodiment of the present disclosure.

FIG. 4B is a driving timing diagram of a shift register provided by another embodiment of the present disclosure, and the driving timing diagram is used to drive the shift register shown in FIG. 3C. That is, when the second control input sub-circuit 202 is electrically connected to the input terminal of the input circuit 100, that is, to the input voltage terminal ESTV, it is necessary to adopt the driving timing diagram shown in FIG. 4B. At this time, it is required that the pulse width of the input voltage Vin at the first level (e.g., high level) is great than the period of the first clock signal VECK and the period of the second clock signal VECB.

As shown in FIG. 4B, the period of the first clock signal VECK is the same as that of the second clock signal VECB, and the pulse width of the input voltage Vin at a high level is great than the period of the first clock signal VECK and the period of the second clock signal VECB.

The circuit function of the shift register corresponding to the driving timing diagram shown in FIG. 4B is exactly the same as that of the shift registers shown in FIGS. 3A and 3B. As shown in FIG. 4B, the working process of the shift register also includes an input phase A, a first phase B, a buffer phase C, and a stabilization phase D. Regarding the input phase A, the buffer phase C, and the stabilization phase D, the circuit operations thereof are exactly the same as the previous process, and will not be repeated here. With regard to the first phase B, the first control signal Vctr1 generated in the first phase B is still a low-level signal, and the second control signal Vctr1 is still a high-level signal, so that the first output terminal can be controlled to output the first voltage signal VH. The specific circuit operation process is similar to the foregoing content, and will not be repeated here.

Figure 5A:
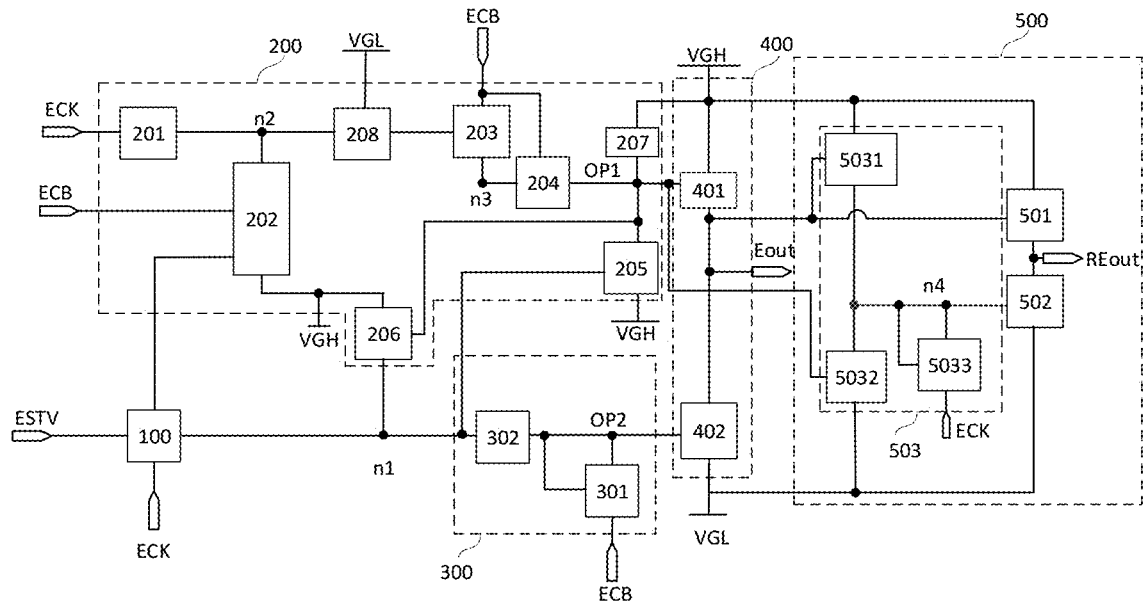
FIG. 5A is a schematic block diagram of still another shift register provided by at least one embodiment of the present disclosure.

FIG. 5A is a schematic block diagram of a shift register provided by at least one embodiment of the present disclosure. As shown in FIG. 5A, based on the shift register shown in FIG. 2B, the shift register further includes an output inverting circuit 500, and the output inverting circuit 500 is electrically connected to the first output node OP1, the first voltage terminal VGH, the second voltage terminal VGL, the first output terminal Eout, and the second output terminal REout, respectively, and is configured to invert the first output signal Vout to obtain the second output signal Rout and output the second output signal Rout to the second output terminal REout.

It should be noted that the output inverting circuit 500 can also be added to the shift register shown in FIG. 2A to obtain the second output signal Rout inverted with the first output signal Vout, and the specific connection relationship will not be described here.

As shown in FIG. 5A, the output inverting circuit includes a first output inverting sub-circuit 501, a second output inverting sub-circuit 502, and an output inverting control sub-circuit 503.

The output inverting control sub-circuit 503 is electrically connected to the first voltage terminal VGH, the first output node OP1, the second voltage terminal VGL, and the fourth node n4, respectively, and is configured to output the fourth control signal Vctr4 to the fourth node n4 under the control of the first control signal Vctr1 and the first output signal Vout, and the fourth control signal Vctr4 is used to control the turn-on and turn-off between the second voltage terminal VGL and the second output terminal REout.

The first output inverting sub-circuit 501 is electrically connected to the first voltage terminal VGH, the first output terminal Eout, and the second output terminal Eout, respectively, and is configured to write the first voltage signal VH to the second output terminal Eout in the second phase under the control of the first output signal Vout. For example, in the second phase, the first output inverting sub-circuit 501 is turned on under the control of the first output signal Vout, that is, one terminal of the first output inverting sub-circuit 501 connected to the first voltage terminal VGH and the other terminal of the first output inverting sub-circuit 501 connected to the second output terminal REout are turned on, the first voltage signal VH is written to the second output terminal REout, and at this time, the second output inverting sub-circuit 502 is turned off under the control of the fourth control signal Vctr4.

The second output inverting sub-circuit 502 is electrically connected to the second voltage terminal VGL, the fourth node n4, and the second output terminal REout, respectively, and is configured to write the second voltage signal VL to the second output terminal REout in the first phase under the control of the fourth control signal Vctr4. For example, in the first phase, the second output inverting sub-circuit 502 is turned on under the control of the fourth control signal Vctr4, that is, one terminal of the second output inverting sub-circuit 502 connected to the second voltage terminal VGL and the other terminal of the second output inverting sub-circuit 502 connected to the second output terminal REout are turned on, the second voltage signal VL is written into the second output terminal REout, and at this time, the first output inverting sub-circuit 501 is turned off under the control of the first output signal Vout.

For example, the second output signal Rout includes the second voltage signal VL in the first phase and the first voltage signal VH in the second phase.

For example, the output inverting control sub-circuit 503 includes a pull-up sub-circuit 5031, a pull-down sub-circuit 5032, and a third bootstrap sub-circuit 5033.

The pull-up sub-circuit 5031 is electrically connected to the first voltage terminal VGH, the first output terminal Eout, and the fourth node n4, respectively, and is configured to write the first voltage signal VH to the fourth node n4 under the control of the first output signal Vout. For example, when the pull-up sub-circuit 5031 is turned on under the control of the first output signal Vout, that is, when one terminal of the pull-up sub-circuit 5031 connected to the first voltage terminal VGH and the other terminal of the pull-up sub-circuit 5031 connected to the fourth node n4 are turned on, the first voltage signal VH is written into the fourth node n4, so that the fourth node n4 is at a high level.

The pull-down sub-circuit 5032 is electrically connected to the first output node OP1, the second voltage terminal VGL, and the fourth node n4, respectively, and is configured to write a third intermediate signal Vmid3 determined based on the second voltage signal VL into the fourth node n4 under the control of the first control signal Vctr1. For example, when the pull-down sub-circuit 5032 is turned on under the control of the first control signal Vctr1, that is, when one terminal of the pull-down sub-circuit 5032 connected to the second voltage terminal VGL and the other terminal of the pull-down sub-circuit 5032 connected to the fourth node n4 are turned on, the third intermediate signal Vmid3 determined based on the second voltage signal VL is written into the fourth node n4, so that the fourth node n4 is at a low level.

The third bootstrap sub-circuit 5033 is electrically connected to the fourth node n4 and the first clock signal terminal ECK, respectively, and is configured to write a fourth intermediate signal Vmid4, which is determined based on the third intermediate signal Vmid3 and the first clock signal VECK, into the fourth node n4 under the control of the voltage of the fourth node. For example, under the bootstrap action of the third bootstrap sub-circuit 5033, the voltage Vn4 of the fourth node n4 may be lower than the voltage of the second clock signal VECK at a low level, and the voltage absolute value of the fourth intermediate signal Vmid4 obtained based on the bootstrap action is greater than that of the third intermediate signal Vmid3.

The fourth control signal includes the first voltage signal, the third intermediate signal Vmid3, and the fourth intermediate signal Vmid4.

Figure 5B:
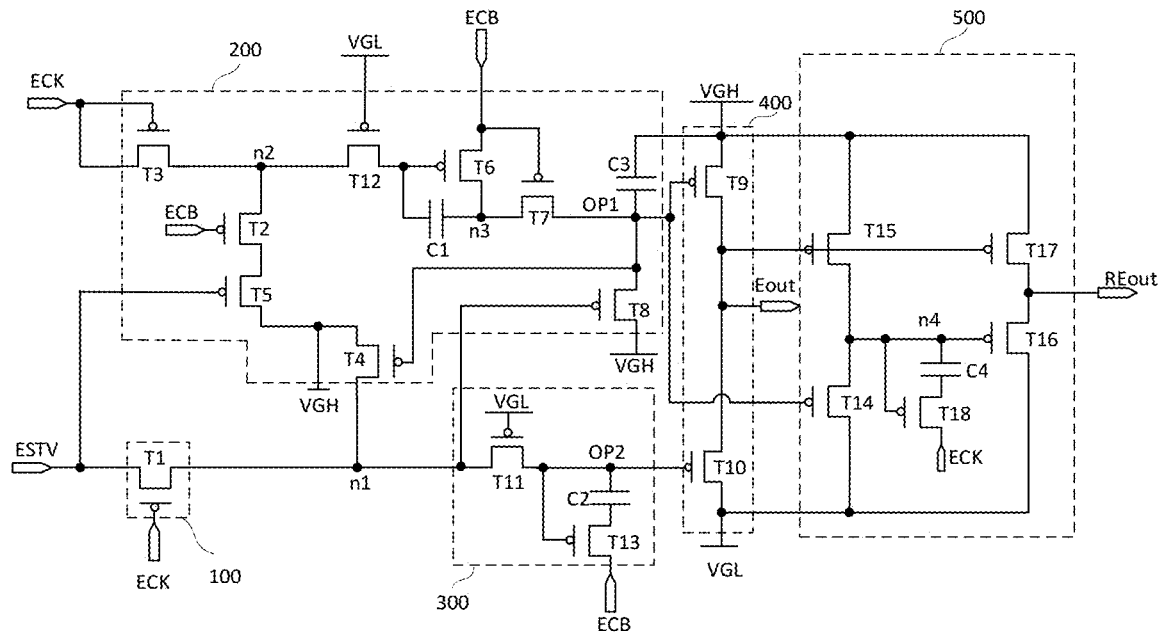
FIG. 5B is a structural schematic diagram of yet another shift register provided by at least one embodiment of the present disclosure.

FIG. 5B is a structural schematic diagram of a shift register provided in an embodiment of the present disclosure. The shift register is based on the shift register shown in FIG. 3C, and the output inverting circuit 500 is added. Therefore, for the structural descriptions of the input circuit 100, the first control circuit 200, the second control circuit 300, and the output circuit 400, please refer to the relevant structural descriptions shown in the schematic diagrams of FIGS. 3A to 3C, and the details will not be repeated here.

It should be noted that the shift register including the output inverting circuit 500 is not limited to the structure shown in FIG. 5B, and the input circuit 100, the first control circuit 200, the second control circuit 300, and the output circuit 400 can be modified and combined with reference to any embodiment of the present disclosure, which is not limited by the present disclosure. For example, the shift register shown in FIGS. 3A and 3B may be added with an output inverting circuit 500, and the present disclosure is not limited to this case.

Next, taking FIG. 5B as an example, the structural relationship of the shift register including the output inverting circuit 500 will be described in detail.

The first output inverting sub-circuit 501 includes a first output inverting transistor T17, and the second output inverting sub-circuit 502 includes a second output inverting transistor T16.

A gate electrode of the first output inverting transistor T17 is electrically connected to the first output terminal Eout, a first electrode of the first output inverting transistor T17 is electrically connected to the first voltage terminal VGH, and a second electrode of the first output inverting transistor T17 is electrically connected to the second output terminal REout.

A gate electrode of the second output inverting transistor T16 is electrically connected to the fourth node n4, a first electrode of the second output inverting transistor T16 is electrically connected to the second voltage terminal VGL, and a second electrode of the second output inverting transistor T16 is electrically connected to the second output terminal REout.

The pull-up sub-circuit 5031 includes a third pull-up transistor T15, a gate electrode of the third pull-up transistor T15 is electrically connected to the first output terminal Eout, a first electrode of the third pull-up transistor T15 is electrically connected to the first voltage terminal VGH, and a second electrode of the third pull-up transistor T15 is electrically connected to the fourth node n4.

The pull-down sub-circuit 5032 includes a second pull-down transistor T14, a gate electrode of the second pull-down transistor T14 is electrically connected to the first output node OP1, a first electrode of the second pull-down transistor T14 is electrically connected to the second voltage terminal VGL, and a second electrode of the second pull-down transistor T14 is electrically connected to the fourth node n4.

The third bootstrap sub-circuit 5033 includes a third capacitor C4 and a third bootstrap transistor T18. A first terminal of the third capacitor C4 and a gate electrode of the third bootstrap transistor T18 are both electrically connected to the fourth node n4, a second electrode of the third bootstrap transistor T18 is electrically connected to the second terminal of the third capacitor C4, and a first electrode of the third bootstrap transistor T18 is electrically connected to the first clock signal terminal ECK.

Figure 5C:
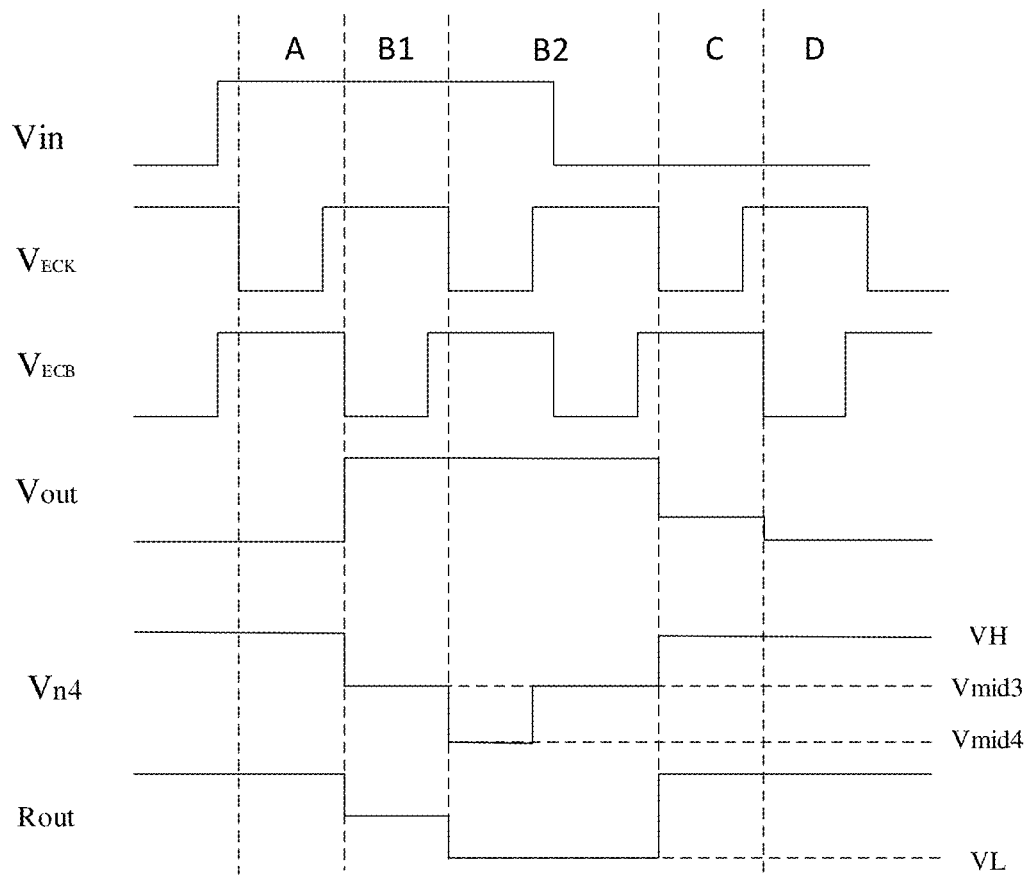
FIG. 5C is a driving timing diagram of still another shift register provided by at least one embodiment of the present disclosure.

FIG. 5C is a driving timing diagram of another shift register provided by an embodiment of the present disclosure. Next, taking the shift register shown in FIG. 5B and the driving timing shown in FIG. 5C as examples, the working principle of the shift register provided by the embodiment of the present disclosure will be introduced.

For example, as shown in FIG. 5C, the working process of the shift register provided by the embodiment of the present disclosure includes an input phase A, a first output phase B1, a second output phase B2, a buffer phase C, and a stabilization phase D, whereat the first phase includes the first output phase B1 and the second output phase B2, and the second phase includes the input phase A, the buffer phase C, and the stabilization phase D.

For the input circuit 100, the first control circuit 200, the second control circuit 300, and the output circuit 400, the working processes at the input phase A, the buffer phase C, and the stabilization phase D can refer to the foregoing descriptions, which will not be repeated here. The first phase B in the above-mentioned working process is divided into the first output phase B1 and the second output phase B2, and the working processes of the first output phase B1 and the second output phase B2 are completely the same as that of the first phase B above. Therefore, the description of the working processes of the input circuit 100, the first control circuit 200, the second control circuit 300, and the output circuit 400 in the first output phase B1 and the second output phase B2 can refer to the above-mentioned description of the first phase B, and is not repeated here.

The following describes the working process of the output inverting circuit 500.

For example, in the input phase A, the first clock signal VECK output by the first clock signal terminal ECK is a low-level signal, the second clock signal VECB output by the second clock signal terminal ECB is a high-level signal, the input voltage Vin output by the input voltage terminal ESTV is a high-level signal, and the first output signal Vout is a low-level signal.

According to the foregoing description of the input phase A, because both the first control output transistor T7 and the second control output transistor T8 are in the turn-off state, the voltage of the first output node OP1 remains unchanged and is still at a high level, so that the second pull-down transistor T14 is in the turn-off state under the control of the voltage of the first output node OP1. In the input phase A, the first output terminal Eout keeps the state of the previous phase unchanged. At this time, the first output signal Vout is a low-level signal, so that under the control of the first output signal Vout, the third pull-up transistor T15 and the first output inverting transistor T17 are in a turn-on state, and the first voltage signal VH is written into the fourth node n4 via the third pull-up transistor T15, so that the fourth node n4 is at a high level, that is, the voltage Vn4 of the fourth node is at a high level VH, thereby controlling the second output inverting transistor T16 to be in the turn-off state. The first voltage signal VH is written into the second output terminal REout via the first output inverting transistor T17, that is, the second output signal Rout is the first voltage signal VH at this time.

In the first output phase B1, the first clock signal VECK output by the first clock signal terminal ECK is a high-level signal, the second clock signal VECB output by the second clock signal terminal ECB is a low-level signal, the input voltage Vin output by the input voltage terminal ESTV is a high-level signal, and the first output signal Vout is a high-level signal.

According to the foregoing description of the first phase B, at this time, the first output signal Vout is the first voltage signal VH, so that the third pull-up transistor T15 and the first output inverting transistor T17 are in the turn-off state, and the voltage Vn4 of the fourth node n4 is no longer affected by the first voltage terminal VGH. The voltage of the first output node OP1 is VL-Vth7, that is, at this time, the first control signal Vctrl1 is at a low level. Under the control of the first control signal Vctrl1, the second pull-down transistor T14 is turned on, and the third intermediate signal Vmid3 determined based on the second voltage signal VL is written into the fourth node n4. The voltage of the third intermediate signal Vmid3 is VL-Vth7-Vth14 because the second pull-down transistor T14 has a threshold loss when transmitting the low-level signal, where Vth7 represents the threshold voltage of the first control output transistor T7 and Vth14 represents the threshold voltage of the second pull-down transistor T14, that is, the voltage Vn4 of the fourth node n4 is VL-Vth7-Vth14 at this time, and when the voltage Vn4 of the fourth node n4 reaches VL-Vth7-Vth14, the second pull-down transistor T14 is turned off.

The third bootstrap transistor T18 is turned on under the control of the voltage Vn4 of the fourth node n4, and transmits the high level of the first clock signal VECK to the second terminal of the third capacitor C4, so that the second terminal of the third capacitor C4 is at the high level.

The voltage Vn4 of the fourth node n4 is VL-Vth7-Vth14, and the second output inverting transistor T16 is turned on to a certain extent. The low-level signal transmitted by the second output inverting transistor T16 has a threshold loss. When the voltage of the second output signal Rout output by the second output terminal REout reaches VL-Vth14-Vth16, the second output inverting transistor T16 is turned off, the voltage of the second output signal Rout no longer drops, so that in the first output phase B1, the voltage of the second output signal Rout is VL-Vth14-Vth16, and the low level output by the second output terminal REout cannot reach the potential of the second voltage signal VL.

In the second output phase B2, when the input voltage Vin is at a high level, the first clock signal VECK output by the first clock signal terminal ECK is a low-level signal, and the second clock signal VECB output by the second clock signal terminal ECB is a high-level signal; when the input voltage Vin is at a low level, the first clock signal VECK output by the first clock signal terminal ECK is a high-level signal, and the second clock signal VECB output by the second clock signal terminal ECB is a low-level signal; the first output signal Vout is a high-level signal in the second output phase B2.

When the input voltage Vin is at a high level, the first control signal Vctrl1 is at a low level and the first output signal Vout is at a high level. Therefore, the third pull-up transistor T15 and the first output inverting transistor T17 are still turned off, and the second pull-down transistor T14 and the second output inverting transistor T16 are both turned off.

From the first output phase B1 to the second output phase B2, the first clock signal VECK jumps from the high level to the low level. Due to the coupling effect of the third capacitor C4, the voltage Vn4 of the fourth node n4 drops to Vmid3-ΔV, that is, the voltage of the fourth intermediate signal Vmid4 is Vmid3-ΔV, and ΔV represents the potential difference between the high level and the low level. Because the voltage Vn4 of the fourth node n4 drops to a voltage value much lower than VL, the second output inverting transistor T16 is better turned on, so that the second voltage signal VL can be output to the second output terminal REout without threshold loss, that is, the second output signal Rout reaches the voltage of the second voltage signal VL.

When the input voltage Vin is at a low level, because the states of the first control signal Vctrl1, the first output signal Vout, and the voltage Vn4 of the fourth node n4 remain unchanged, the second output signal Rout remains the second voltage signal VL.

In the buffer phase C, the first clock signal VECK output by the first clock signal terminal ECK is a low-level signal, the second clock signal VECB output by the second clock signal terminal ECB is a high-level signal, the input voltage Vin output by the input voltage terminal ESTV is a low-level signal, and the first output signal Vout is a low-level signal, that is, the third voltage signal.

According to the above description of the buffer phase C, the first control signal Vctr1 is the first voltage signal VH, that is, at this time, the first output node OP1 is at a high level, so the second pull-down transistor T14 is in a turn-off state. The first output signal Vout is the third voltage signal VL1, and the voltage absolute value of the third voltage signal VL1 is less than the second voltage signal VL. Under the control of the third voltage signal VL1, the third pull-up transistor T15 and the first output inverting transistor T17 are both turned on. The first voltage signal VH is written into the fourth node n4 via the third pull-up transistor T15, so that the fourth node n4 is at a high level. At this time, the voltage Vn4 of the fourth node n4 is the first voltage signal VH, and the second output inverting transistor T16 is in a turn-off state. The first voltage signal VH is written into the second output terminal REout via the first output inverting transistor T17, and the second output terminal REout outputs a high-level signal, that is, the second output signal Rout is the first voltage signal VH at this time.

In the stabilization phase D, the first clock signal VECK output by the first clock signal terminal ECK is a high-level signal, the second clock signal VECB output by the second clock signal terminal ECB is a low-level signal, the input voltage Vin output by the input voltage terminal ESTV is a low-level signal, and the first output signal Vout is a low-level signal, that is, the second voltage signal VL.

Similar to the buffer phase C, under the control of the high level of the first output node OP1, the second pull-down transistor T14 is in the turn-off state, and under the control of the second voltage signal VL, both the third pull-up transistor T15 and the first output inverting transistor T17 are turned on, so that the second output inverting transistor T16 is also in the turn-off state. The first voltage signal VH is written into the second output terminal REout via the first output inverting transistor T17, and the second output terminal REout still outputs a high-level signal, that is, the second output signal Rout is the first voltage signal VH at this time.

Figure 5D:
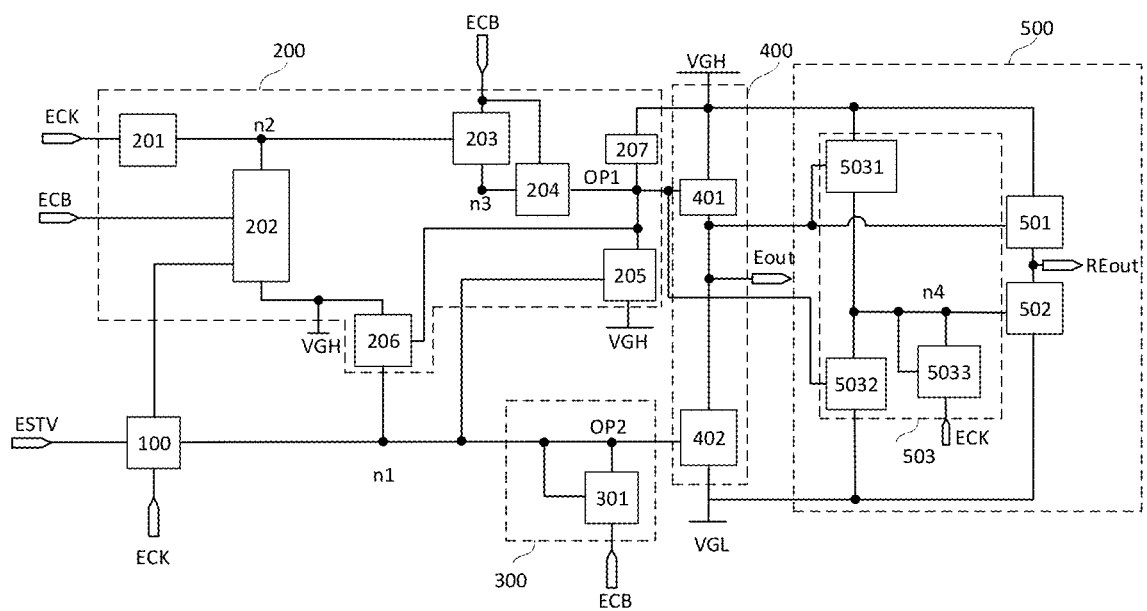
FIG. 5D is a schematic block diagram of still yet another shift register provided by at least one embodiment of the present disclosure.

FIG. 5D is a schematic block diagram of another shift register provided by at least one embodiment of the present disclosure. As shown in FIG. 5D, based on the shift register shown in FIG. 2A, the shift register further includes an output inverting circuit 500, the output inverting circuit 500 is electrically connected to the first output node OP1, the first voltage terminal VGH, the second voltage terminal VGL, the first output terminal Eout, and the second output terminal REout, respectively, and is configured to invert the first output signal Vout to obtain the second output signal Rout and output the second output signal Rout to the second output terminal REout.

The structural relationship of the shift register including the output inverting circuit 500 shown in FIG. 5D and the driving timing diagram can refer to the foregoing, and the repetition will not be repeated here.

Figure 6:
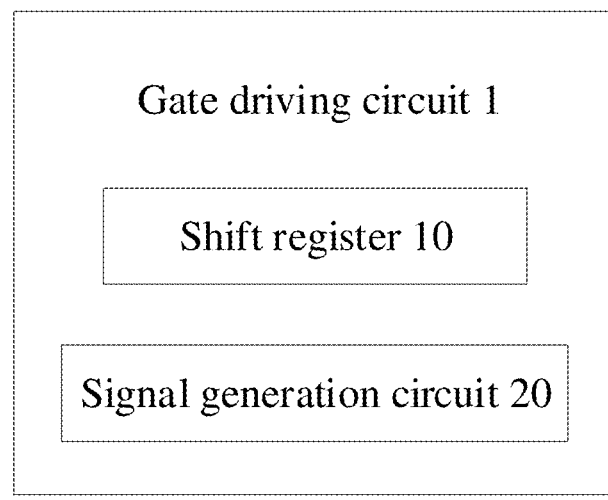
FIG. 6 is a schematic block diagram of a gate driving circuit provided by at least one embodiment of the present disclosure.
Figure 7A:
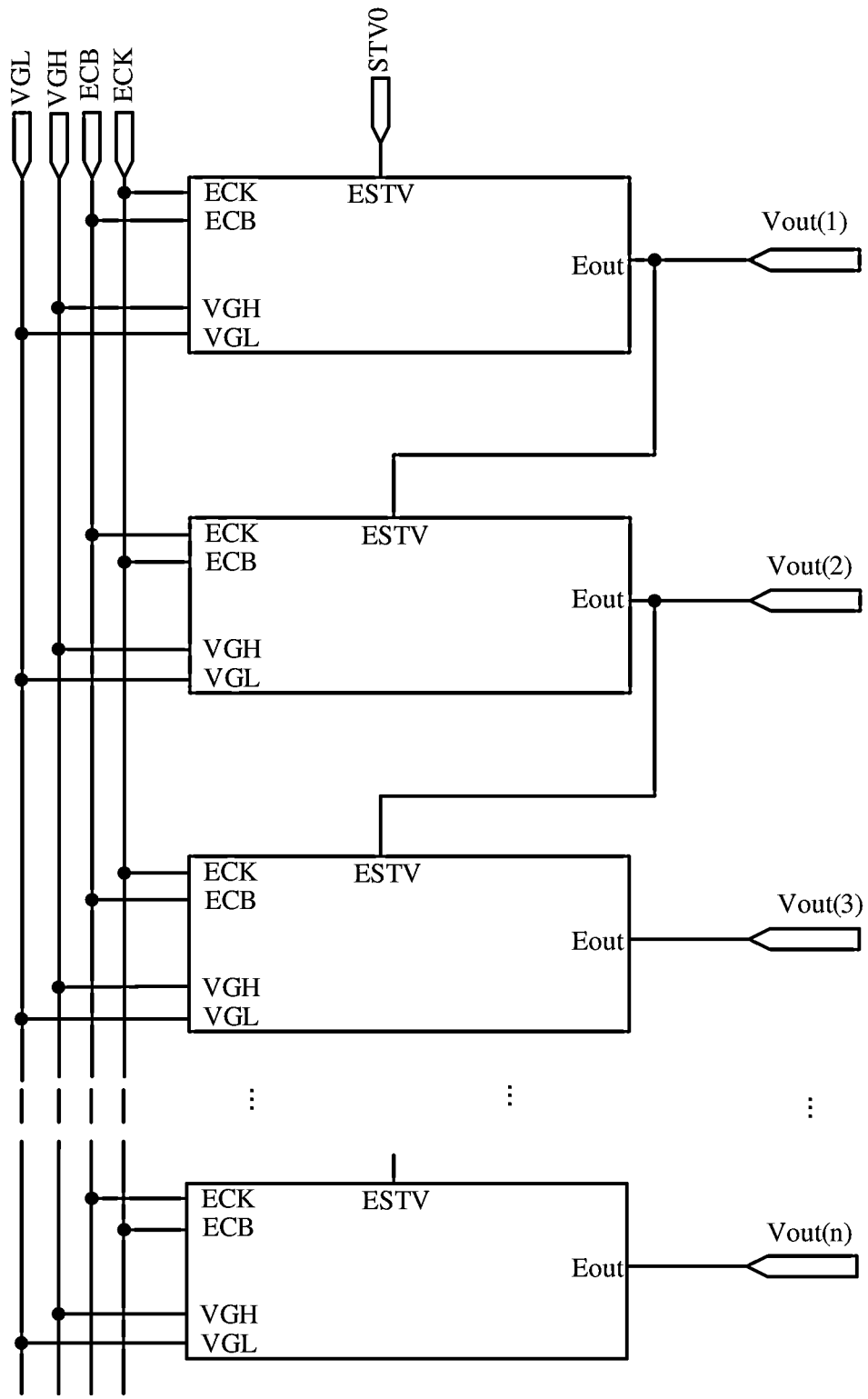
FIG. 7A is a structural schematic diagram of a gate driving circuit provided by at least one embodiment of the present disclosure.

FIG. 6 is a schematic block diagram of a gate driving circuit provided by an embodiment of the present disclosure, and FIG. 7A is a structural schematic diagram of a gate driving circuit provided by an embodiment of the present disclosure.

At least one embodiment of the present disclosure also provides a gate driving circuit, and as shown in FIG. 6, the gate driving circuit 1 includes the shift register 10 described in any of the above embodiments of the present disclosure. The gate driving circuit provided by the present disclosure can output a level opposite to the turn-on level of the transistor through the shift register 10, for example, when the transistor is a P-type transistor, the gate driving circuit outputs a high-level pulse.

For example, as shown in FIG. 7A, the gate driving circuit 1 includes a plurality of shift registers SR1, SR2, SR3, ... SRn in cascade. These shift registers SR1, SR2, SR3 ... SRn can all be the shift register described in any of the above embodiments of the present disclosure. The first output terminals Eout of these shift registers SR1, SR2, SR3 ... SRn are respectively connected to a plurality of gate lines G1, G2, G3 ... Gn (not shown) in one-to-one correspondence.

For example, except for a first stage shift register, a first output terminal of an M-th stage shift register is used as an input voltage terminal connected to an (M+1)-th stage shift register, where M is a positive integer and M is greater than 1. Therefore, the working state of the next stage shift register is controlled by the first output signal of the previous stage shift register, and the pulse scanning signals are sequentially output.

For example, the input voltage terminal ESTV of the first stage shift register SR1 is connected to a trigger signal terminal STV0 (which is configured to provide a trigger signal to control the gate driving circuit to start working) to receive the trigger signal as the input voltage Vin.

For example, as shown in FIG. 6, the gate driving circuit 1 further includes a signal generation circuit 20. As shown in FIG. 7A, the signal generation circuit 20 is configured to generate a first signal CK and a second signal CB. For example, for the (2N−1)-th stage shift register, the first signal CK is the first clock signal VECK in the above-mentioned embodiment of the shift register, and the second signal CB is the second clock signal VECB in the above-mentioned embodiment of the shift register. For the (2N)-th stage shift register, the first signal CK is the second clock signal VECB in the above-mentioned embodiment of the shift register, and the second signal CB is the first clock signal VECK in the above-mentioned embodiment of the shift register. The first signal CK and the second signal CB alternately control the shift registers in odd-numbered stages and even-numbered stages, thereby reducing the number of signals and the production cost.

For example, as shown in FIG. 7A, the first signal CK is applied to the first clock signal terminal ECK connected to the (2N−1)-th stage shift register and the second clock signal terminal ECB connected to the (2N)-th stage shift register; the second signal CB is applied to the second clock signal terminal ECB connected to the (2N−1)-th stage shift register and the first clock signal terminal ECK connected to the (2N)-th stage shift register, where N is a positive integer, and N is greater than or equal to 1 and less than n/2. It should be noted that n can be an even number or an odd number, and the present disclosure is not limited to this case. In the example shown in FIG. 7A, n is an even number.

It should be noted that the above-mentioned "previous stage" and "next stage" do not refer to the previous stage and the next stage in the scanning sequence, but to the previous stage and the next stage in the physical connection.

For example, taking the first stage shift register SR1 and the second stage shift register SR2 as examples, the trigger signal terminal STV0 provides the trigger signal STV0 to the first stage shift register SR1 as the input voltage Vin, thus controlling the first stage shift register SR1 to start working. Under the control of the first signal CK and the second signal CB, the first stage shift register SR1 outputs the first output signal Vout(1) to the gate line G1 as the scanning signal, and the first output signal Vout (1) output from the first stage shift register SR1 is transmitted to the second stage shift register SR2 and is used as the input voltage of the second stage shift register SR2, thereby controlling the second stage shift register SR2 to start working. Under the control of the first signal CK and the second signal CB, the second stage shift register SR2 outputs the second output signal Vout (2) to the gate line G2 as the scanning signal, and transmits the first output signal Vout (2) output by the second stage shift register SR2 to its next stage shift register to be used as the input voltage of its next-stage shift register, and so on. Finally, the gate driving circuit completes the scanning work of one frame.

Figure 7B:
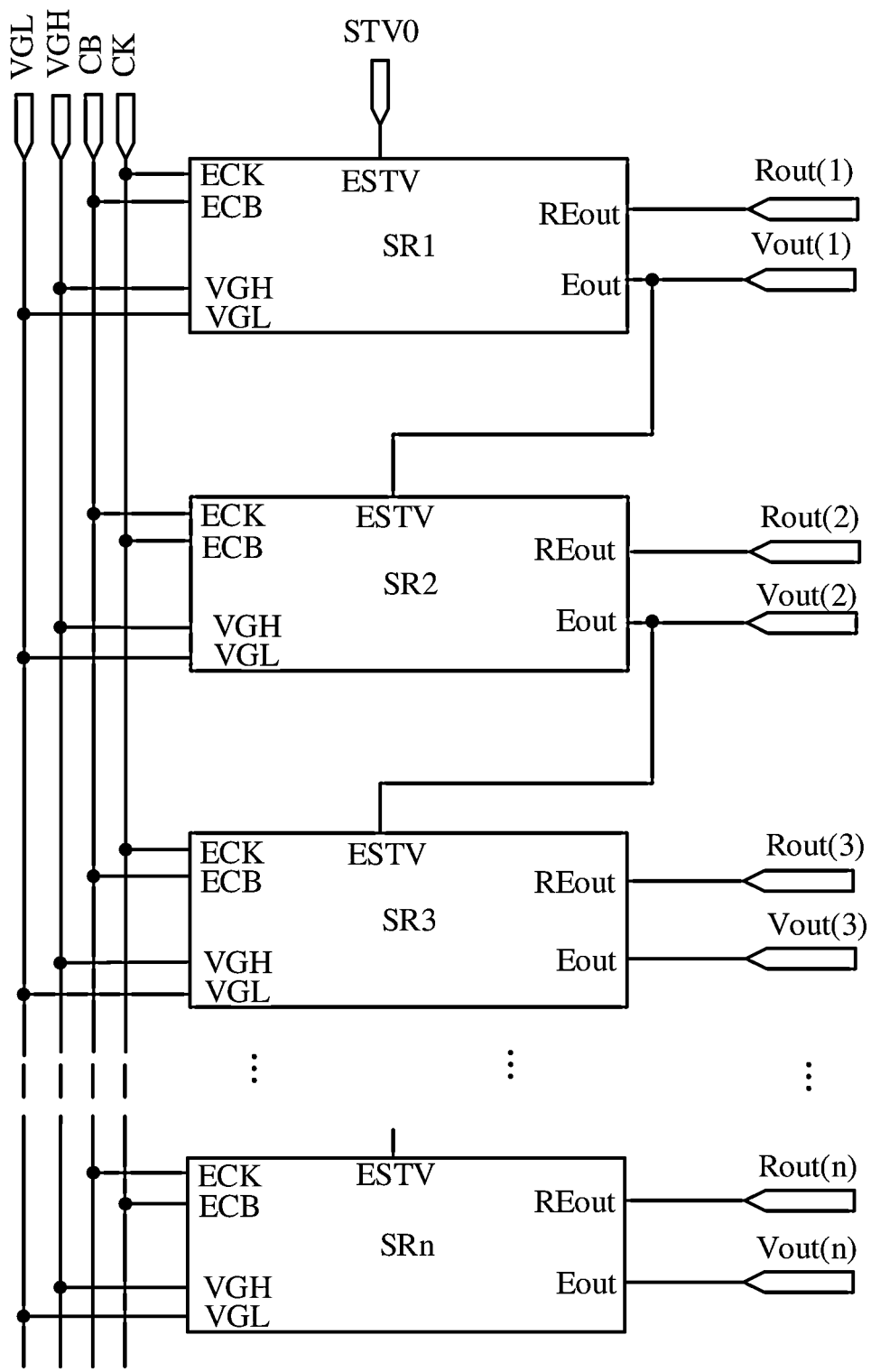
FIG. 7B is a structural schematic diagram of another gate driving circuit provided by at least one embodiment of the present disclosure.

FIG. 7B is a structural schematic diagram of another gate driving circuit according to an embodiment of the present disclosure.

The gate driving circuit 1 includes the shift register including the output inverting circuit in the above embodiment of the present disclosure, for example, the shift register shown in FIGS. 5A and 5B.

As shown in FIG. 7B, each of these shift registers SR1, SR2, SR3 . . . SRn has a second output terminal REout in addition to the first output terminal Eout, and the second output terminal REout outputs a second output signal Rout which is inverted from the first output signal Vout. For example, the second output signal Rout(1) is a signal having a phase inverted to the phase of the first output signal Vout(1), and the second output signal Rout(2) is a signal having a phase inverted to the phase of the first output signal Vout(2), and so on.

The connection relationship and scanning process of the shift registers SR1, SR2, SR3, . . . SRn in the gate driving circuit 1 are as described above, so the repetitions will not be repeated here.

Figure 8:
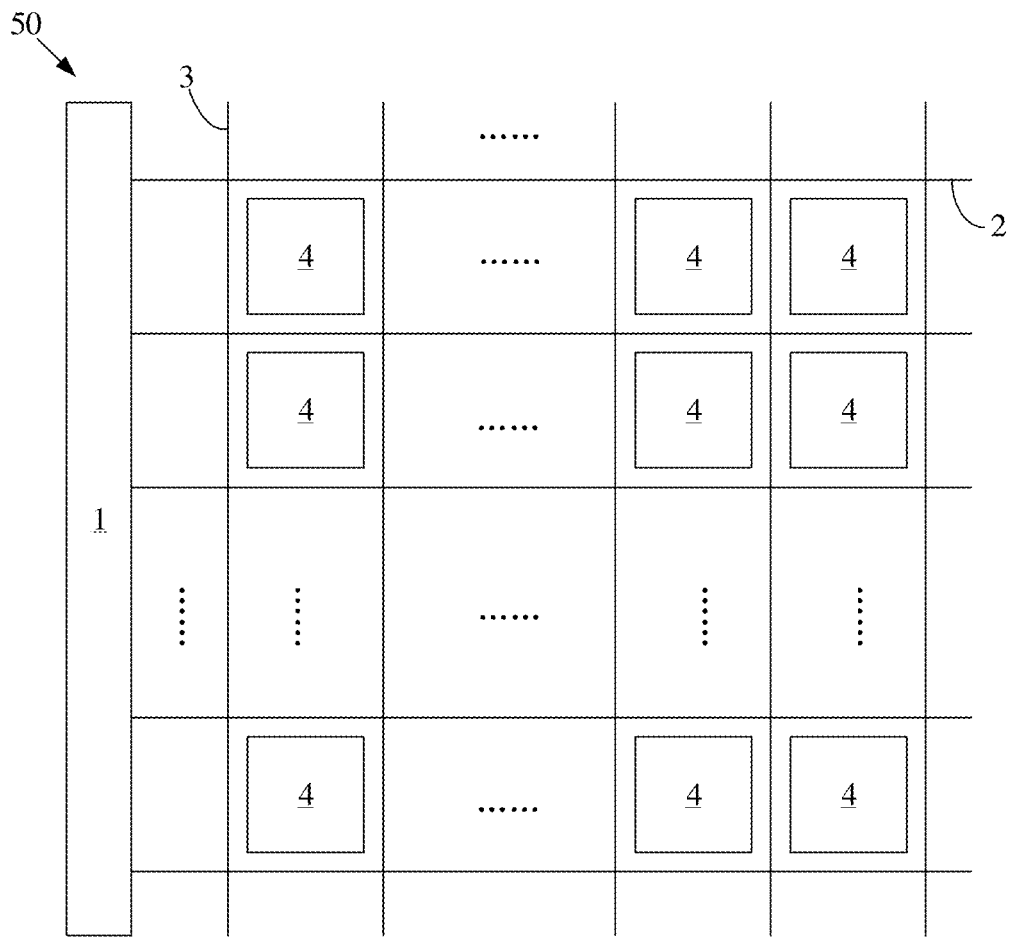
FIG. 8 is a schematic diagram of a display device provided by at least one embodiment of the present disclosure.

FIG. 8 is a schematic diagram of a display device according to an embodiment of the present disclosure.

The embodiment of the present disclosure also provides a display device 50. As shown in FIG. 8, the display device 50 includes the gate driving circuit 1 provided by any embodiment of the present disclosure.

For example, as shown in FIG. 8, the display device 50 provided by the embodiment of the present disclosure further includes gate lines 2, data lines 3, and a plurality of pixel units 4 defined by the intersection of the gate lines 2 and the data lines 3, and the gate driving circuit 1 is configured to provide a gate driving signal to the gate line 2.

For example, each stage of the shift registers SR1, SR2, SR3, . . . SRn is used to output a gate driving signal to the corresponding gate line of the gate lines G1, G2, G3, . . . Gn.

For example, the display device 50 can be any product or component with a display function, such as a mobile phone, a tablet computer, a television, a monitor, a notebook computer, a digital photo frame, a navigator, etc.

At least one embodiment of the present disclosure also provides a driving method of a shift register, and the driving method is used to drive the shift register according to at least one embodiment of the present disclosure.

Figure 9:
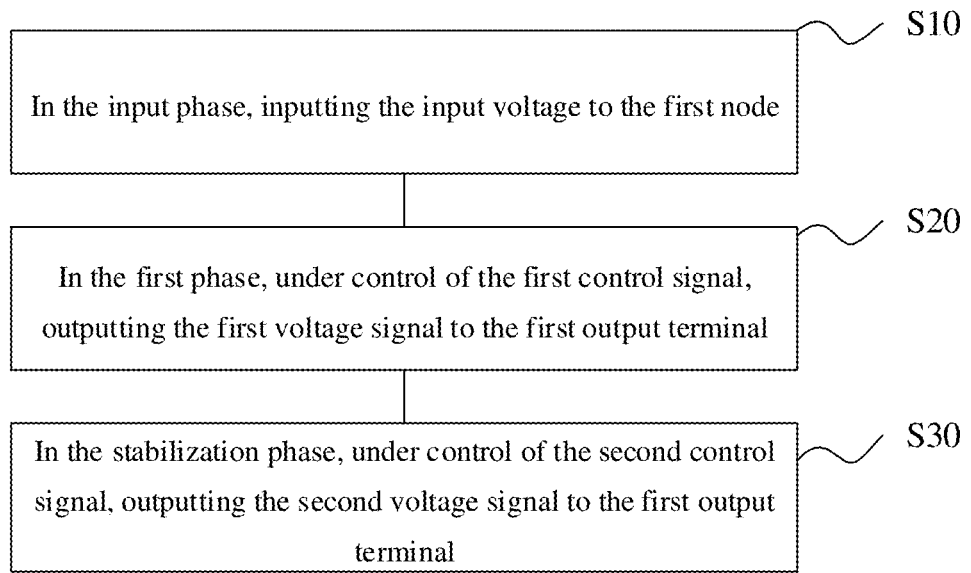
FIG. 9 is a flowchart of a driving method provided by at least one embodiment of the present disclosure.

FIG. 9 is a flowchart of a driving method provided by an embodiment of the present disclosure.

The embodiment of the present disclosure also provides a driving method of the shift register, as shown in FIG. 9, the driving method includes the following steps:

S10: in the input phase, inputting the input voltage to the first node.

S20: in the first phase, under control of the first control signal, outputting the first voltage signal to the first output terminal.

S30: in the stabilization phase, under control of the second control signal, outputting the second voltage signal to the first output terminal.

The driving method of the shift register provided by the embodiment of the present disclosure can implement that the P-type transistor outputs a level opposite to the turn-on level of the P-type transistor, for example, a high-level pulse.

It should be noted that, for the specific operation process of the driving method provided by the embodiment of the present disclosure, reference may be made to the related descriptions of the input phase A, the first phase B, the buffer phase C, and the stabilization phase D in the above-mentioned embodiments of the shift register, and the repetitions are not repeated here.

For the present disclosure, the following statements should be noted:

(1) the accompanying drawings of the embodiment(s) of the present disclosure involve only the structure(s) in connection with the embodiment(s) of the present disclosure, and other structure(s) can refer to common design(s);

(2) for the purpose of clarity only, in the accompanying drawings for illustrating the embodiment(s) of the present disclosure, the thickness and size of a layer or a structure may be enlarged. However, it should be understood that, in the case in which a component or element such as a layer, film, region, substrate, or the like is referred to be "on" or "under" another component or element, it may be directly on or under the another component or element or a component or element is interposed therebetween.

(3) in case of no conflict, the embodiments of the present disclosure and the features in the embodiment(s) can be combined with each other to obtain new embodiment(s).

What have been described above are only specific implementations of the present disclosure, the protection scope of the present disclosure is not limited thereto, and the protection scope of the present disclosure should be based on the protection scope of the claims.

What is claimed is:

1. A shift register, comprising: an input circuit, a first control circuit, a second control circuit, and an output circuit, wherein the input circuit is electrically connected to an input voltage terminal, a first clock signal terminal, and a first node, respectively, and is configured to input an input voltage provided by the input voltage terminal to the first node under control of a first clock signal provided by the first clock signal terminal;

the first control circuit is electrically connected to the first clock signal terminal, a second clock signal terminal, a first voltage terminal, the first node, and a first output node, respectively, and is configured to output a first control signal to the first output node under control of the first clock signal, a voltage of the first node, and a second clock signal provided by the second clock signal terminal;

the second control circuit is electrically connected to the first node, the second clock signal terminal, and a second output node, respectively, and is configured to output a second control signal to the second output node under control of the voltage of the first node; and the output circuit is electrically connected to the first voltage terminal, a second voltage terminal, the first output node, the second output node, and a first output terminal, respectively, and is configured to write a first voltage signal provided by the first voltage terminal or a second voltage signal provided by the second voltage terminal into the first output terminal as a first output signal under control of the first control signal and the second control signal;

the first control circuit is further electrically connected to the Input circuit, the first control circuit comprises a second control input sub-circuit, the second control input sub-circuit is electrically connected to the input circuit, the second clock signal terminal, the first voltage terminal, and a second node, respectively, and is configured to write the first voltage signal into the second node under control of the input voltage and the second clock signal;

the input circuit comprises an input terminal connected to the input voltage terminal and an output terminal connected to the first node, the second control input sub-circuit is electrically connected to the output terminal of the input circuit, or the second control input sub-circuit is electrically connected to the input terminal of the input circuit;

the second control input sub-circuit comprises a first pull-up transistor and a second pull-up transistor, a first electrode of the first pull-up transistor is electrically connected to a second electrode of the second pull-up transistor, a second electrode of the first pull-up transistor is electrically connected to the second node, a gate electrode of the first pull-up transistor is electrically connected to the second clock signal terminal, a gate electrode of the second pull-up transistor is electrically connected to the input terminal of the input circuit or the output terminal of the input circuit, and a first electrode of the second pull-up transistor is electrically connected to the first voltage terminal.

2. The shift register according to claim 1, wherein the first control circuit is configured to control the output circuit to output the first voltage signal at a first phase;

the second control circuit is configured to control the output circuit to output the second voltage signal at a second phase; and the first output signal comprises the first voltage signal in the first phase and the second voltage signal in the second phase;

wherein the output circuit is further configured to write a third voltage signal into the first output terminal in the second phase under control of the first control signal and the second control signal, wherein the first output signal further comprises the third voltage signal, and a voltage absolute value of the third voltage signal is less than a voltage absolute value of the second voltage signal.

3. The shift register according to claim 1, wherein the first control circuit comprises a first control input sub-circuit, the first control input sub-circuit is electrically connected to the first clock signal terminal and the second node, respectively, and is configured to write a third control signal to the second node under control of the first clock signal.

4. The shift register according to claim 3, wherein the first control input sub-circuit comprises a first pull-down transistor, a first electrode of the first pull-down transistor is electrically connected to the first clock signal terminal, a second electrode of the first pull-down transistor is electrically connected to the second node, and a gate electrode of the first pull-down transistor is electrically connected to the first clock signal terminal.

5. The shift register according claim 3, wherein the first control circuit further comprises a holding sub-circuit, the holding sub-circuit is electrically connected to the first voltage terminal, the first node, and the first output node, respectively, and is configured to maintain a level of the first node in the first phase;

wherein the holding sub-circuit comprises a holding transistor, a first electrode of the holding transistor is electrically connected to the first voltage terminal, a second electrode of the holding transistor is electrically connected to the first node, and a gate electrode of the holding transistor is electrically connected to the first output node.

6. The shift register according to claim 3, wherein the first control circuit further comprises a storage sub-circuit, the storage sub-circuit is electrically connected to the first voltage terminal and the first output node, respectively, and is configured to store a voltage of the first output node;

wherein the storage sub-circuit comprises a storage capacitor, a first terminal of the storage capacitor is electrically connected to the first voltage terminal, and a second terminal of the storage capacitor is electrically connected to the first output node.

7. The shift register according to claim 1, wherein the first control circuit comprises a first bootstrap sub-circuit, a first control output sub-circuit, and a second control output sub-circuit, the first bootstrap sub-circuit is electrically connected to the second node, a third node, and the second clock signal terminal, respectively, and is configured to write a first intermediate signal into the third node under control of a voltage of the second node;

the first control output sub-circuit is electrically connected to the second clock signal terminal, the third node, and the first output node, respectively, and is configured to write a second intermediate signal into the first output node under control of the second clock signal;

the second control output sub-circuit is electrically connected to the first node, the first voltage terminal, and the first output node, respectively, and is configured to write the first voltage signal into the first output node under control of the voltage of the first node, wherein the first control signal comprises the second intermediate signal and the first voltage signal;

the first bootstrap sub-circuit comprises a first capacitor and a first bootstrap transistor, a gate electrode of the first bootstrap transistor is electrically connected to the second node and a first terminal of the first capacitor, a second electrode of the first bootstrap transistor is electrically connected to a second terminal of the first capacitor and the third node, and a first electrode of the first bootstrap transistor is electrically connected to the second clock signal terminal;

the first control output sub-circuit comprises a first control output transistor, a gate electrode of the first control output transistor is electrically connected to the second clock signal terminal, a first electrode of the first control output transistor is electrically connected to the third node, and a second electrode of the first control output transistor is electrically connected to the first output node; and the second control output sub-circuit comprises a second control output transistor, a gate electrode of the second control output transistor is electrically connected to the first node, a first electrode of the second control output transistor is electrically connected to the first voltage terminal, and a second electrode of the second control output transistor is electrically connected to the first output node.

8. The shift register according to claim 7, wherein the first control circuit is further electrically connected to the second voltage terminal, the first control circuit further comprises a first isolation sub-circuit, an input terminal of the first isolation sub-circuit is electrically connected to the second node, an output terminal of the first isolation sub-circuit is electrically connected to the first bootstrap sub-circuit, and a control terminal of the first isolation sub-circuit is electrically connected to the second voltage terminal;

the first isolation sub-circuit comprises a first isolation transistor, a first electrode of the first isolation transistor is electrically connected to the second node, a second electrode of the first isolation transistor is electrically connected to the first bootstrap sub-circuit, and a gate electrode of the first isolation transistor is electrically connected to the second voltage terminal.

9. The shift register according to claim 1, wherein the second control circuit comprises a second bootstrap sub-circuit, the second bootstrap sub-circuit is electrically connected to the first node, the second clock signal terminal, and the second output node, respectively;

wherein the second bootstrap sub-circuit comprises a second capacitor and a second bootstrap transistor, a first electrode of the second bootstrap transistor is electrically connected to the second clock signal terminal, a first terminal of the second capacitor is electrically connected to a gate electrode of the second bootstrap transistor and the second output node, and a second terminal of the second capacitor is electrically connected to a second electrode of the second bootstrap transistor.

10. The shift register according to claim 1, wherein the second control circuit further comprises a second isolation sub-circuit, an input terminal of the second isolation sub-circuit is electrically connected to the first node, an output terminal of the second isolation sub-circuit is electrically connected to the second output node, and a control terminal of the second isolation sub-circuit is electrically connected to the second voltage terminal;

wherein the second isolation sub-circuit comprises a second isolation transistor, a first electrode of the second isolation transistor is electrically connected to the first node, a second electrode of the second isolation transistor is electrically connected to the second output node, and a gate electrode of the second isolation transistor is electrically connected to the second voltage terminal.

11. The shift register according to claim 1, wherein the output circuit comprises a first output sub-circuit and a second output sub-circuit, the first output sub-circuit is electrically connected to the first output node, the first voltage terminal, and the first output terminal, respectively, and is configured to write the first voltage signal into the first output terminal in the first phase under control of the first control signal;

the second output sub-circuit is electrically connected to the second output node, the second voltage terminal, and the first output terminal, respectively, and is configured to write the second voltage signal into the first output terminal in the second phase under control of the second control signal;

wherein the first output sub-circuit comprises a first output transistor, a gate electrode of the first output transistor is electrically connected to the first output node, a first electrode of the first output transistor is electrically connected to the first voltage terminal, and a second electrode of the first output transistor is electrically connected to the first output terminal;

the second output sub-circuit comprises a second output transistor, a gate electrode of the second output transistor is electrically connected to the second output node, a first electrode of the second output transistor is electrically connected to the second voltage terminal, and a second electrode of the second output transistor is electrically connected to the first output terminal.

12. The shift register according to claim 1, wherein the shift register further comprises an output inverting circuit, the output inverting circuit is electrically connected to the first output node, the first voltage terminal, the second voltage terminal, the first output terminal, and a second output terminal, respectively, and is configured to invert the first output signal to obtain a second output signal and output the second output signal to the second output terminal;

wherein the output inverting circuit comprises a first output inverting sub-circuit, a second output inverting sub-circuit, and an output inverting control sub-circuit, the output inverting control sub-circuit is electrically connected to the first voltage terminal, the first output node, the second voltage terminal, and a fourth node, respectively, and is configured to output a fourth control signal to the fourth node under control of the first control signal and the first output signal;

the first output inverting sub-circuit is electrically connected to the first voltage terminal, the first output terminal, and the second output terminal, respectively, and is configured to write the first voltage signal into the second output terminal in the second phase under control of the first output signal;

the second output inverting sub-circuit is electrically connected to the second voltage terminal, the fourth node, and the second output terminal, respectively, and is configured to write the second voltage signal into the second output terminal in the first phase under control of the fourth control signal; and the second output signal comprises the second voltage signal in the first phase and the first voltage signal in the second phase.

13. The shift register according to claim 12, wherein the output inverting control sub-circuit comprises a pull-up sub-circuit, a pull-down sub-circuit, and a third bootstrap sub-circuit, the pull-up sub-circuit is electrically connected to the first voltage terminal, the first output terminal, and the fourth node, respectively, and is configured to write the first voltage signal into the fourth node under control of the first output signal;

the pull-down sub-circuit is electrically connected to the first output node, the second voltage terminal, and the fourth node, respectively, and is configured to write a third intermediate signal determined based on the second voltage signal into the fourth node under control of the first control signal;
the third bootstrap sub-circuit is electrically connected to the fourth node and the first clock signal terminal, respectively, and is configured to write a fourth intermediate signal determined based on the third intermediate signal and the first clock signal into the fourth node under control of a voltage of the fourth node,
wherein the fourth control signal comprises the first voltage signal, the third intermediate signal, and the fourth intermediate signal.

14. The shift register according to claim 13,
wherein the pull-up sub-circuit comprises a third pull-up transistor, a gate electrode of the third pull-up transistor is electrically connected to the first output terminal, a first electrode of the third pull-up transistor is electrically connected to the first voltage terminal, and a second electrode of the third pull-up transistor is electrically connected to the fourth node;
the pull-down sub-circuit comprises a second pull-down transistor, a gate electrode of the second pull-down transistor is electrically connected to the first output node, a first electrode of the second pull-down transistor is electrically connected to the second voltage terminal, and a second electrode of the second pull-down transistor is electrically connected to the fourth node; and
the third bootstrap sub-circuit comprises a third capacitor and a third bootstrap transistor, a first terminal of the third capacitor and a gate electrode of the third bootstrap transistor are both electrically connected to the fourth node, a second electrode of the third bootstrap transistor is electrically connected to a second terminal of the third capacitor, and a first electrode of the third bootstrap transistor is electrically connected to the first clock signal terminal.

15. A gate driving circuit, comprising a shift register,
wherein the shift register comprises: an input circuit, a first control circuit, a second control circuit, and an output circuit,
the input circuit is electrically connected to an input voltage terminal, a first clock signal terminal, and a first node, respectively, and is configured to input an input voltage provided by the input voltage terminal to the first node under control of a first clock signal provided by the first clock signal terminal;
the first control circuit is electrically connected to the first clock signal terminal, a second clock signal terminal, a first voltage terminal, the first node, and a first output node, respectively, and is configured to output a first control signal to the first output node under control of the first clock signal, a voltage of the first node, and a second clock signal provided by the second clock signal terminal;
the second control circuit is electrically connected to the first node, the second clock signal terminal, and a second output node, respectively, and is configured to output a second control signal to the second output node under control of the voltage of the first node; and
the output circuit is electrically connected to the first voltage terminal, a second voltage terminal, the first output node, the second output node, and a first output terminal, respectively, and is configured to write a first voltage signal provided by the first voltage terminal or a second voltage signal provided by the second voltage terminal into the first output terminal as a first output signal under control of the first control signal and the second control signal;
the first control circuit is further electrically connected to the input circuit,
the first control circuit comprises a second control input sub-circuit,
the second control input sub-circuit is electrically connected to the input circuit, the second clock signal terminal, the first voltage terminal, and a second node, respectively, and is configured to write the first voltage signal into the second node under control of the input voltage and the second clock signal;
the input circuit comprises an input terminal connected to the input voltage terminal and an output terminal connected to the first node,
the second control input sub-circuit is electrically connected to the output terminal of the input circuit, or the second control Input sub-circuit is electrically connected to the input terminal of the input circuit;
the second control input sub-circuit comprises a first pull-up transistor and a second pull-up transistor, a first electrode of the first pull-up transistor is electrically connected to a second electrode of the second pull-up transistor, a second electrode of the first pull-up transistor is electrically connected to the second node, a gate electrode of the first pull-up transistor is electrically connected to the s second clock signal terminal, a gate electrode of the second pull-up transistor is electrically connected to the input terminal of the input circuit or the output terminal of the input circuit, and a first electrode of the second pull-up transistor is electrically connected to the first voltage terminal.

16. The gate driving circuit according to claim 15, wherein the gate driving circuit comprises a plurality of the shift registers in cascade,
wherein except for a first stage shift register of the plurality of the shift registers, a first output terminal of an M-th stage shift register of the plurality of the shift registers is used as an input voltage terminal connected to an (M+1)-th stage shift register of the plurality of the shift registers,
where M is a positive integer, and M is greater than 1;
the gate driving circuit further comprises a signal generation circuit,
wherein the signal generation circuit is configured to generate a first signal and a second signal,
the first signal is applied to a first clock signal terminal connected to a (2N−1)-th stage shift register of the plurality of the shift registers and a second clock signal terminal connected to a (2N)-th stage shift register of the plurality of the shift registers;
the second signal is applied to a second clock signal terminal connected to the (2N−1)-th stage shift register and a first clock signal terminal connected to the (2N)-th stage shift register;
where N is a positive integer, and N is greater than or equal to 1.

17. A display device, comprising the gate driving circuit according to claim 15.

18. A driving method of a shift register for driving a shift register,
wherein the shift register comprises: an input circuit, a first control circuit, a second control circuit, and an output circuit,
the input circuit is electrically connected to an input voltage terminal, a first clock signal terminal, and a first node, respectively, and is configured to input an input voltage provided by the input voltage terminal to the first node under control of a first clock signal provided by the first clock signal terminal;

the first control circuit is electrically connected to the first clock signal terminal, a second clock signal terminal, a first voltage terminal, the first node, and a first output node, respectively, and is configured to output a first control signal to the first output node under control of the first clock signal, a voltage of the first node, and a second clock signal provided by the second clock signal terminal;

the second control circuit is electrically connected to the first node, the second clock signal terminal, and a second output node, respectively, and is configured to output a second control signal to the second output node under control of the voltage of the first node; and the output circuit is electrically connected to the first voltage terminal, a second voltage terminal, the first output node, the second output node, and a first output terminal, respectively, and is configured to write a first voltage signal provided by the first voltage terminal or a second voltage signal provided by the second voltage terminal into the first output terminal as a first output signal under control of the first control signal and the second control signal, the first control circuit is further electrically connected to the input circuit, the first control circuit comprises a second control input sub-circuit, the second control input sub-circuit is electrically connected to the input circuit, the second clock signal terminal, the first voltage terminal, and a second node, respectively, and is configured to write the first voltage signal into the second node under control of the input voltage and the second clock signal;

the input circuit comprises an input terminal connected to the input voltage terminal and an output terminal connected to the first node, the second control input sub-circuit is electrically connected to the output terminal of the input circuit, or the second control input sub-circuit is electrically connected to the input terminal of the input circuit;

the second control input sub-circuit comprises a first pull-up transistor and a second pull-up transistor, a first electrode of the first pull-up transistor is electrically connected to a second electrode of the second pull-up transistor, a second electrode of the first pull-up transistor is electrically connected to the second node, a gate electrode of the first pull-up transistor is electrically connected to the second clock signal terminal, a gate electrode of the second pull-up transistor is electrically connected to the input terminal of the input circuit or the output terminal of the input circuit, and a first electrode of the second pull-up transistor is electrically connected to the first voltage terminal, the output circuit outputs the first voltage signal at a first phase and the second voltage signal at a second phase, the second phase comprises an input phase and a stabilization phase, wherein the driving method comprises:

in the input phase, inputting the input voltage to the first node;

in the first phase, under control of the first control signal, outputting the first voltage signal to the first output terminal;

in the stabilization phase, under control of the second control signal, outputting the second voltage signal to the first output terminal.

19. The driving method according to claim 18, wherein the second phase further comprises a buffer phase, the driving method further comprises:

in the buffer phase, under control of the second control signal, outputting a third voltage signal to the first output terminal, wherein the first output signal further comprises the third voltage signal, and a voltage absolute value of the third voltage signal is less than a voltage absolute value of the second voltage signal;

wherein the first control circuit is electrically connected to the input voltage terminal, a pulse width of the input voltage at a first level is great than a period of the first clock signal and a period of the second clock signal.

\* \* \* \* \*

UNITED STATES PATENT AND TRADEMARK OFFICE
CERTIFICATE OF CORRECTION

PATENT NO. : 12,198,772 B2
APPLICATION NO. : 17/759641
DATED : January 14, 2025
INVENTOR(S) : Haigang Qing and Yunsheng Xiao It is certified that error appears in the above-identified patent and that said Letters Patent is hereby corrected as shown below:

In the Claims

6th line from the bottom of Claim 15, reads "s second clock signal", should be changed to "second clock signal".

Signed and Sealed this
Sixth Day of May, 2025

Coke Morgan Stewart
*Acting Director of the United States Patent and Trademark Office*